(12) United States Patent
Albrecht et al.

(10) Patent No.: US 8,987,040 B2
(45) Date of Patent: Mar. 24, 2015

(54) MANUFACTURING MEANS AND PROCESS

(75) Inventors: Dirk Albrecht, Fehrbellin (DE); Jürgen Liepert, Eisingersdorf (DE); Michael Büchler, Augsburg (DE); Rudolf Huber, München (DE); Thomas Kugler, Aichach (DE); Peter Kiemstedt, Dasing (DE)

(73) Assignees: Kuka Systems GmbH, Augsburg (DE); Dirk Albrecht, Fehrbellin (DE)

( * ) Notice: Subject to any disclaimer, the term of this patent is extended or adjusted under 35 U.S.C. 154(b) by 147 days.

(21) Appl. No.: 13/701,308

(22) PCT Filed: Jun. 1, 2011

(86) PCT No.: PCT/EP2011/059165
§ 371 (c)(1),
(2), (4) Date: Nov. 30, 2012

(87) PCT Pub. No.: WO2011/151430
PCT Pub. Date: Dec. 8, 2011

(65) Prior Publication Data
US 2013/0065353 A1 Mar. 14, 2013

(30) Foreign Application Priority Data

Jun. 2, 2010 (DE) .................... 20 2010 005 555 U
Aug. 31, 2010 (DE) .................... 20 2010 008 418 U

(51) Int. Cl.
*H01L 21/00* (2006.01)
*H01L 31/048* (2014.01)
(Continued)

(52) U.S. Cl.
CPC ........ *H01L 31/048* (2013.01); *B32B 17/10036* (2013.01); *B32B 17/10798* (2013.01); *B32B 17/10816* (2013.01); *H01L 21/67092* (2013.01); *H01L 21/67132* (2013.01); *Y02E 10/50* (2013.01)
USPC ........... 438/73; 438/4; 257/E21.211; 156/443

(58) Field of Classification Search
CPC .......... H01L 31/18; B32B 38/00; B23P 19/10
USPC ................... 438/4, 73; 257/E31.001, E21.53, 257/E21.211
See application file for complete search history.

(56) References Cited

U.S. PATENT DOCUMENTS 3,565,719 A 2/1971 Dupont
4,057,439 A 11/1977 Lindmayer
(Continued)

FOREIGN PATENT DOCUMENTS

DE 3 013 037 A1 10/1981
DE 10 2007 038 240 A1 2/2009
(Continued)

*Primary Examiner* — Caleb Henry
(74) *Attorney, Agent, or Firm* — McGlew and Tuttle, P.C.

(57) ABSTRACT

A production device (2) and a method for forming multilayered (3, 4, 5, 6, 7) modules, in particular solar modules (1), which have at least one translucent sheet-like layer (3, 6) and at least one solar- or light-active element is provided. The production device (2) forms the layer structure and has an applicator (33) for a connecting layer (5, 7) for the aforementioned layers (3, 4, 6). Furthermore, the device has a controllable curve(arch)-forming device (17) for bending and rolling a sheet-like layer (3, 6) while the layers are being applied.

20 Claims, 16 Drawing Sheets

(51) Int. Cl.
*B32B 17/10* (2006.01)
*H01L 21/67* (2006.01)

(56) References Cited

U.S. PATENT DOCUMENTS

| | | |
|---|---|---|
| 4,224,081 A | 9/1980 | Kawamura et al. |
| 4,322,261 A | 3/1982 | Dubois |
| 5,252,850 A | 10/1993 | Schempp |
| 2001/0026349 A1 | 10/2001 | Furukawa et al. |
| 2003/0005954 A1 | 1/2003 | Emoto et al. |
| 2007/0048152 A1* | 3/2007 | Conally ................. 417/411 |
| 2007/0294883 A1* | 12/2007 | Napetschnig ............ 29/743 |
| 2008/0132033 A1 | 6/2008 | Eguchi et al. |
| 2008/0138936 A1 | 6/2008 | Yamamoto et al. |
| 2008/0279659 A1 | 11/2008 | Kobayashi |
| 2010/0167460 A1* | 7/2010 | Yane ........................ 438/85 |
| 2010/0178716 A1* | 7/2010 | Zapalac et al. ............. 438/4 |
| 2010/0185315 A1* | 7/2010 | Schmidt et al. .......... 700/160 |
| 2010/0242517 A1* | 9/2010 | Johnson .................. 62/259.4 |
| 2010/0243148 A1* | 9/2010 | Kaufmann et al. ........ 156/256 |
| 2010/0258444 A1* | 10/2010 | Weiner et al. .............. 205/137 |
| 2010/0310993 A1* | 12/2010 | Yamaguchi ................ 430/325 |
| 2011/0073241 A1* | 3/2011 | Hase et al. ................. 156/79 |
| 2011/0083791 A1* | 4/2011 | Nakazono et al. ........... 156/64 |
| 2011/0104988 A1* | 5/2011 | Wenninger ................... 451/5 |
| 2011/0107969 A1* | 5/2011 | Shimizu et al. ......... 118/723 E |
| 2012/0247683 A1* | 10/2012 | Matsumoto et al. ........ 156/578 |
| 2013/0065353 A1* | 3/2013 | Albrecht et al. ............ 438/73 |

FOREIGN PATENT DOCUMENTS

| | | |
|---|---|---|
| DE | 10 2008 012286 A1 | 9/2009 |
| EP | 0 415 340 A1 | 3/1991 |
| EP | 1 302 988 A2 | 4/2003 |
| EP | 1 498 933 A2 | 1/2005 |
| JP | 2000 349136 A | 12/2000 |
| JP | 2002 083992 A | 3/2002 |
| JP | 2004 022997 A | 1/2004 |
| JP | 2005 026377 A | 1/2005 |
| JP | 2008 277652 A | 11/2008 |
| JP | 2009 043872 A | 2/2009 |
| WO | 03/069682 A2 | 8/2003 |

* cited by examiner

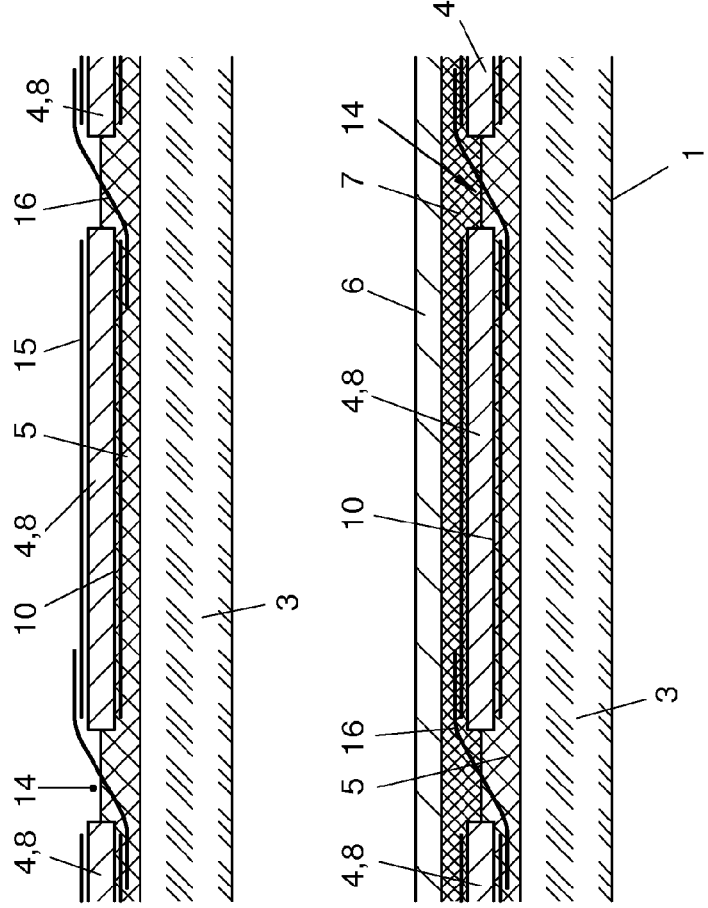

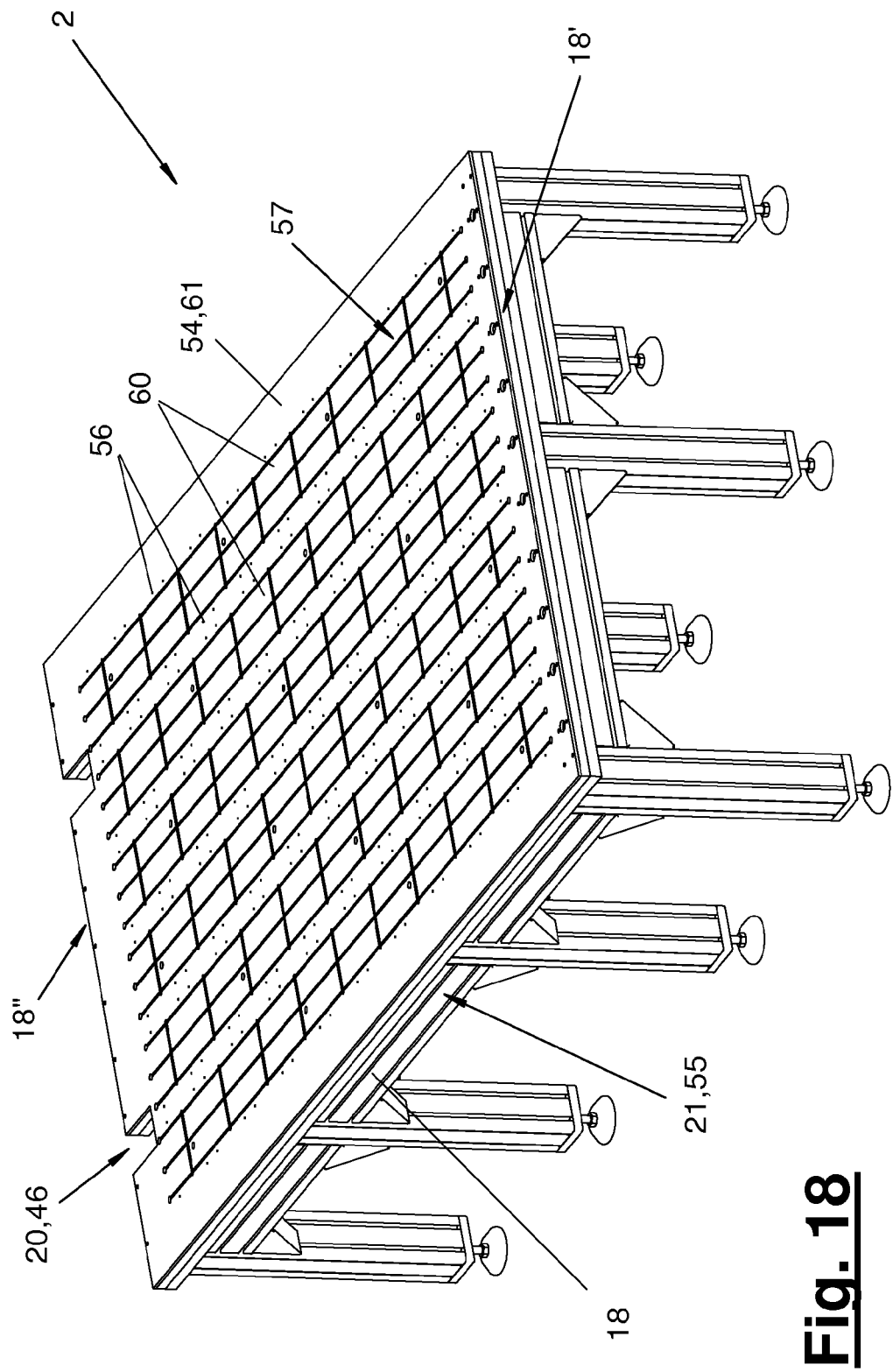

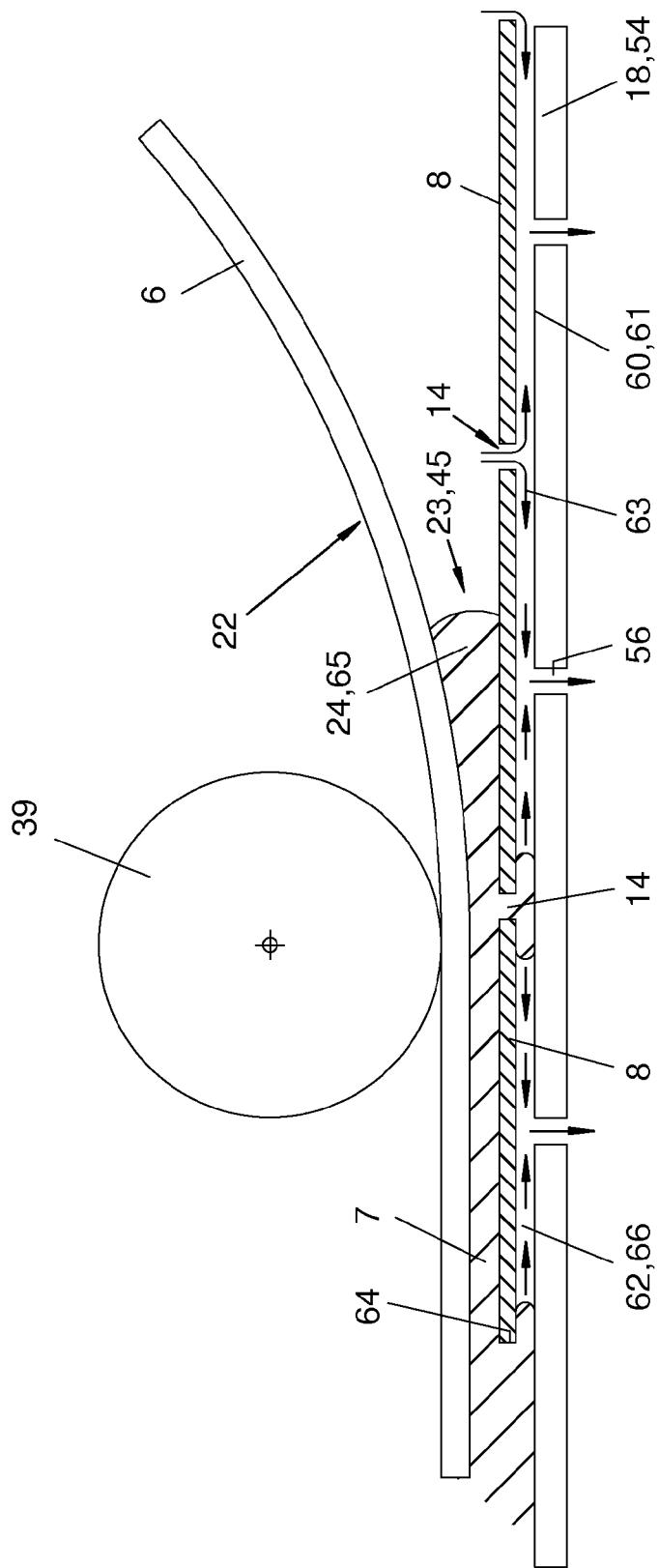

MANUFACTURING MEANS AND PROCESS

CROSS REFERENCE TO RELATED APPLICATIONS

This application is a United States National Phase application of International Application PCT/EP2011/059165 and claims the benefit of priority under 35 U.S.C. §119 of German Patent Applications DE 20 2010 005 555.5 filed Jun. 2, 2010 and DE 20 2010 008 418.0 filed Aug. 31, 2010, the entire contents of each are incorporated herein by reference.

FIELD OF THE INVENTION

The present invention pertains to a manufacturing device and a manufacturing process for a multilayer module.

BACKGROUND OF THE INVENTION

Such a manufacturing device and a manufacturing process are known from DE 10 2007 038 240 A1. Solar cells are placed on a casting table with suction openings and fixed with vacuum. Suction openings are formed on the casting table in the area below the solar cells placed on the casting table in order to fix the solar cells on the casting table by means of vacuum. The casting table is subsequently moved under a casting device at a portal, and a flowable bonding material in the form of a polyolefin plastisol is applied from said casting device to the solar cells. The array of solar cells is thus coated with an outer layer. This is carried out by means of so-called curtain coating or doctoring, so that the array of solar cells is coated over a broad area while passing through under the casting device. In the next step, a robot feeds a glass plate. The glass plate is placed and rolled on the previously prepared coating covering the solar cells by means of height-adjustable suction holders in an arc-shaped and bubble-free manner. By laying down the glass plate gradually and in an arc-shaped manner, bubble formation between the polyolefin plastisol layer and the glass plate is prevented from occurring. The three-layer module element thus formed is transported further with a conveyor to a heating device and a turning device, and a cover layer in the form of a second glass plate is subsequently applied along with an adhesive with a glass plate doubling device, and the finished module is fixed in a heating means and the adhesive is cured.

EP 1 0302 988 A2 likewise teaches a manufacturing device and a manufacturing process for manufacturing a multilayer solar module with embedded solar cells with the use of an arching means for a plate-like, transparent layer. The arching device is part of a roller laminator in this case.

US 2003/0005954 A1 pertains to the formation of arched multilayer solar modules, where a glass plate is arched as well. This is carried out by heating a flat glass plate over a swage, after which the glass plate is deformed into the swage under its own weight and assumes the arch of the swage. The arch is maintained and not abolished again.

SUMMARY OF THE INVENTION

An object of the present invention is to provide an improved manufacturing technique for multilayer modules, especially solar modules, as well as for basic components thereof.

One aspect of the present invention pertains to a manufacturing technique for multilayer solar modules or multilayer basic components with a transparent, plate-like layer and at least one solar-active element, wherein a manufacturing device forms the layer structure and has an applicator for a bonding layer as well as a controllable arching means for bending a plate-like layer, especially a glass plate. The arching means has a support, especially a table, for a plate-like layer with a holding-down device arranged at the edge and with a height-adjustable pressing element, which act on a plate-like layer.

The manufacturing technique being claimed has various advantages. Due to the fact that the arching of a plate-like layer, especially of a carrier of the multilayer solar module, can be controlled and relaxed especially well, an even more uniform and reliable distribution of a flexible bonding compound, especially in the paste or liquid form, can be achieved. A rolling and distributing effect can be achieved on the previously applied bonding compound by mutually pressing the layers to be bonded to one another and by relaxing the arching. Embedding on all sides and enclosing of the solar-active element can also be facilitated by the displacement of the bonding compound.

Mechanical bending and arching of a plate-like layer, especially a transparent glass or plastic plate, by a lifting and lowering motion of a pressing element, can be controlled especially well and reliably. The arch may be formed in the area of a preferably stationary support and close to the application and bonding site. The arch can relax due to the intrinsic elasticity of the plate-like layer and yielding of the pressing element. The operation can be supported by a pressing element, e.g., a rotatable roller moved along the plate-like layer, wherein a pressing pressure may also be built up for better and intimate bonding of the layer. The feed of the pressing element can be coordinated with the reverse or lowering motion of the pressing element, which is favorable for a controlled roll-on operation for the uniform distribution of the preferably liquid or paste-like bonding material and for expelling residues of air. Such an arching means can be controlled better and more accurately than a movable suction means, especially because the roll-on operation is more uniform than in the case of mutually spaced suction holders, as they are employed in the state of the art. In addition, the build-up of pressure is better, higher and more uniform.

The manufacturing technique being claimed has, furthermore, the advantage that the entire solar module can be manufactured completely in one station and at one support. As an alternative, a production line with a plurality of stations following each is also possible for carrying out the individual steps.

It is advantageous, furthermore, that the finished solar elements, especially strings or complete solar cell arrays, can be applied with connection lines already placed and embedded between the other layers of the module. A guide means may also be advantageous for this at the support plate of a table with grooves or the like for accurate positioning and fixation, especially by means of possibly controllable suction pressure.

The same arching and rolling technique may be used for different plate-like layers, especially for a front glass pane and a rear glass pane. A flexible backing film or the like may also be applied, with an arch, as a cover layer in a similar manner.

It is favorable, furthermore, that a bonding layer optionally made of a liquid or paste-like or film-like bonding material can be applied to one or more solar element(s) or to a plate-like layer, especially a glass plate. Furthermore, it is advantageous for reasons of process safety that the different processing steps can be carried out at a stationary and table-like support. This is advantageous especially in respect to the accuracy with which a handling means can be positioned. In addition, an application and dispensing means associated with the support can apply said bonding material more accurately and with a higher reproducibility.

The feeding of the different layers may be carried out by means of a suitable handing means, especially a multiaxial manipulator, preferably an articulated-arm robot. The handling means may possibly also build up a pressing pressure.

The handling operations within the manufacturing device can also be simplified and accelerated by the handling means. In addition, additional functions, especially checking and testing of solar-active elements and the connection thereof and optionally the establishment of such an electrically conductive connection by means of soldering or the like, may also be carried out by means of such a handling means.

The transparent, plate-like layer, especially said carrier, with a solar-active element embedded and connected by means of the bonding compound, may represent a basic component for the manufacture of different types of solar modules. The manufacturing technique employed for this may always be the same, so that large quantities and great savings can be achieved in the manner of a modular system. The further manufacturing operations may be module-specific and depend on the type of the solar-active elements.

In addition, it is advantageous for the further manufacturing steps to use an application technique and an applicator that also applies one or more additional layers by means of a rolling process to the basic component. For example, a flexurally elastic cover layer in the form of a film can be applied here by rolling, and a fluidic adhesive is introduced and at the same time distributed in the roll wedge or roll gap.

The bonding compound for embedding solar-active elements, especially solar cells or hybrid arrays, has the advantage that it can replace the EVA films and form a reliable as well as transparent bond between a transparent carrier and a layer of at least one solar-active element, e.g., a photoactive solar cell or a hybrid array. The one or more solar-active elements can be embedded in the bonding compound and enclosed by same on a plurality of sides. This also ensures sealing of the solar-active elements against environmental effects, especially the entry of air and moisture. This is especially advantageous at the edge area of the solar module, which can be waterproofed and sealed better than before.

The bonding compound is initially elastic and can yield or be compressed, and, e.g., a paste-like or liquid consistency is advantageous for this. However, compressible films may be used as well. After embedding the solar-active element or elements, the bonding compound can solidify, e.g., by curing, which is possible by the reaction of the components of a multicomponent material by photocuring or in another manner. The entire system of layers is stabilized by the solidification and the bonding effect, especially a bonding or adhesion effect of the bonding compound is produced or stabilized.

Due to its elastic consistency, the bonding compound can be applied more easily and reliably in a bubble-free manner. In particular, air gaps between the solar-active element and the transparent carrier are avoided. This is advantageous, although not absolutely necessary. The bonding compound may form, in particular, an all-over and very thin contact layer in the bonding area. This may be advantageous for avoiding output-reducing reflections or refractions of the incident light beams.

The type and structure of the further layers may vary. The cover layer may be, e.g., the aforementioned flexible film. As an alternative, it may also be a stabilizing plate, e.g., a glass plate.

The manufacturing technique being claimed may also be used for other types of solar modules, which are present, e.g., with heat-absorbing layer or bodies as a solar-active element or in addition to such an element. Vapor-deposited or printed solar-active elements on a transparent carrier can also be processed and bonded with plate-like cover layers by means of the manufacturing technique by means of arching them and introducing a bonding compound.

According to another aspect of the present invention, a process is provided for manufacturing an array of layers with a plurality of light- or solar-active elements for a multilayer module, especially solar module, wherein the process comprises the following steps:

Formation of an array of light emitting/light sensing elements on a support formed with suction openings by placing the light emitting/light sensing elements on the support, application of a liquid or paste-like bonding compound to the array of light emitting/light sensing elements, and formation of an adhering system of layers with the array of light emitting/light sensing elements, wherein the plate-like layer is placed on the array of light emitting/light sensing elements by means of an arching means with an arch or curvature, a suction pressure acting at least into interspaces between the light emitting/light sensing elements placed on the support is applied via the suction openings, and the light emitting/light sensing elements are embedded in the bonding compound in a bubble-free manner such that at least part of their outer surface is covered by the bonding compound by the arch of the plate-like layer relaxing on the array of light emitting/light sensing elements with the bonding compound applied thereto, and the bonding compound is introduced at least into the interspaces under the suction effect of the suction pressure.

Another aspect of the present invention makes provisions for the use of the process for manufacturing a multilayer module, especially a solar module with solar cells.

It is made possible by means of the process to embed the photoactive or solar-active elements in the bonding or layer compound without defective inclusion of air bubbles occurring. In general, gas inclusions are avoided in the bonding compound and/or in areas in which the bonding compound and the outer surface of the light emitting/light sensing elements or the bonding compound and the surface of the plate-like layer join each other. The suction effect generated via the suction openings in the intermediate areas between the light emitting/light sensing elements placed on the support causes, on the one hand, the air present there to be drawn off during the introduction of the bonding compound. However, air bubbles possibly occurring during the formation of the adhering array of layers are also drawn off (subsequently) by means of the suction effect in the interspaces.

The light emitting/light sensing elements may be solar cells, i.e., elements that absorb light to generate electric energy. In another embodiment, the process may also be used to embed light-emitting elements (as the light emitting/light sensing elements), especially in the form of light-emitting diodes, in the array of layers.

The relaxation of the arch or curvature of the plate-like layer during the formation of the adhering system of layers means that the plate-like layer, which is initially arched locally or as a whole, passes over to the shape of a flat plate at the end of the process at the latest, so that the array of light emitting/light sensing elements is covered extensively. The relaxation may be a single-time process here, for example, when the plate-like layer is arched or curved as a whole at the beginning and it then relaxes during the formation of the system of layers. Provisions may also be made for forming a curvature/arch during the relaxation of the arch or curvature at first in local areas of the plate only, after which said curvature/arch moves along over the array of light emitting/light sensing elements during rolling, so that the bonding compound is incorporated piece by piece, which finally leads to the embedding of the light emitting/light sensing elements. The curvature/arch of the plate-like layer may be made with different radii as a function of the system of layers to be produced. Provisions may also be made for an initial radius of the arch/curvature to be different during the relaxation process for local areas of the plate-like layer. On the whole, a controlled relaxation of the plate-like layer is carried out, so that this layer is essentially flat at the end.

The application of the liquid or paste-like bonding compound may be carried out before and/or during the placement of the plate-like layer with the arch/curvature on the array of light emitting/light sensing elements. The bonding compound is preferably applied by means of a dispensing means, in which the application of the bonding compound is carried out with a nozzle-type dispenser, i.e., a dispenser with which the width of application is negligible compared to the extension of the array of light emitting/light sensing elements. The bonding compound can thus be distributed linearly over the array of light emitting/light sensing elements before the plate-like layer is applied. The application lines may have any desired line shape. Contrary to the state of the art, in which a slotted nozzle is used, which covers with its slot width the width of the array of light emitting/light sensing elements as comprehensively as possible, the process being proposed makes possible the application-optimized distribution of the bonding compound applied, especially such that the formation and maintenance of a standing wave of the bonding compound is supported during the relaxation of the plate-like layer.

It proved to be advantageous in an embodiment to apply bonding compound to the surface of the plate-like layer facing the array of light emitting/light sensing elements before the plate-like layer is applied. This may also be carried out with the dispensing means described.

Provisions may also be made for applying bonding compound after placing the plate-like layer with the arch/curvature on the array of light emitting/light sensing elements, for example, also such that more bonding compound is applied in addition to bonding compound already applied.

The forming and relaxing of the arch/curvature of the plate-like layer are supported in one embodiment by the layer consisting of a flexurally elastic material.

Further process steps, for example, treatment with a heating means, for example, for curing the bonding compound, may be provided when forming the adhering system of layers.

The support used with the suction openings has an array of suction openings, which are distributed over the working surface of the support, namely, over the area in which the light emitting/light sensing elements are placed. The outlets in the area of the working surface may be designed as hole openings. Provisions may also be made for using a support, in which air ducts expand towards the working surface of the support, especially also in the form of surface ducts, which are designed, for example, as grooves. Development of an individual pressure distribution over the working surface of the support during the process steps is thus supported. Provisions may be made for a plurality of suction openings in the area of the support to be connected with one another in the material of the support via ducts. The support may thus be formed with a duct structure which makes possible the development of different pressure conditions in locally separated areas of the support. Provisions may also be made, for example, for the suction effect to be adapted to the changes in the relaxation of the arch/curvature over time, for example, such that the suction pressure is higher in the area of an instantaneous arch/curvature of the plate-like layer and/or adjacent thereto than in areas of the support that are remote therefrom. When the curvature/arch area or the relaxation area of the plate-like layer is then moving along over the array of light emitting/light sensing elements, i.e., over the support, the area with the increased suction pressure is being moved along by the suction opening being actuated correspondingly. Control engineering for the application-dependent actuation of the suction openings, individually and/or in groups, is known as such in various embodiments.

Preferred embodiments of the process for producing an array of layers with a plurality of light emitting/light sensing elements for a multilayer module will be described in more detail below.

Provisions are made in a preferred variant of the present invention for the suction pressure in the interspaces to be generated by means of suction openings, which are arranged at the support in the area of the interspaces and/or under the light emitting/light sensing elements deposited. Providing suction openings under the light emitting/light sensing elements deposited has the advantage that these suction openings can additionally ensure flat contact of the light emitting/light sensing elements on the support, for example, when the light emitting/light sensing elements had been previously bowed. Fixation of the positions of the deposited elements is thus achieved as well. Should the array of suction openings have exclusively suction openings under the light emitting/light sensing elements deposited, it shall be ensured that the suction effect also extends into the intermediate areas between the light emitting/light sensing elements deposited. This is achieved, for example, by the working surface of the support, on which the light emitting/light sensing elements are deposited, being formed with a roughness that permits the suction effect to develop in the interspaces or intermediate areas.

Provisions may be made in an advantageous embodiment of the present invention for the bonding compound to enter, at least peripheral edge areas of the light emitting/light sensing elements, into an area in which the surface of the support and an associated surface of the light emitting/light sensing elements are located opposite each other, in a bubble-free manner due to the suction pressure. It is ensured in this manner, for example, that edge areas of the light emitting/light sensing elements are partly or completely embedded in the bonding compound on the side of the light emitting/light sensing elements facing the support.

Provisions are made in an advantageous embodiment of the present invention for an overpressure to be admitted to one or more of the suction openings after the formation of the adhering system of layers in order to support separation of the adhering system of layers from the support.

Provisions are preferably made in a variant of the present invention for the suction openings to be actuated individually and/or in groups in respect to an associated suction/overpressure in order to set locally different pressure conditions. Local areas of the support can thus be set up individually in terms of the pressure conditions, especially for different segments of the process.

Provisions may be made in an advantageous embodiment of the present invention for depositing light emitting/light sensing elements contacted on the front side and/or on the rear side during the formation of the array of light emitting/light sensing elements on the support, where contact lines are arranged in surface impressions on the support in case of the light emitting/light sensing elements contacted on the front side. Front-side contacting is carried out, for example, by means of so-called contact filaments in case of solar cells.

Provisions may be made in an advantageous embodiment of the present invention for a standing wave of the bonding compound running over the array of light emitting/light sensing elements to be generated during the relaxation of the arch or curvature of the plate-like layer in a wedge between the array of light emitting/light sensing elements on the support and the surface of the plate-like layer facing the array of light emitting/light sensing elements. The standing wave of the bonding compound may also be considered to be a kind of a bead running over the array of light emitting/light sensing elements. This advantageously supports the prevention of inclusions of air in the bonding compound. It proved to be advantageous in this connection to apply a quantity of bonding compound to the plate-like layer before this layer is placed on the array of light emitting/light sensing elements. Especially the initial formation of the wave at the beginning of the relaxing depositing of the plate-like layer is supported hereby.

Provisions are made in a preferred variant of the present invention for introducing bonding compound in the wedge between the array of light emitting/light sensing elements on the support and the surface of the plate-like layer facing the array of light emitting/light sensing elements during the relaxation of the arch or curvature of the plate-like layer by means of a dispensing means, optionally also in addition to bonding compound introduced previously. The dispensing of the bonding compound into the wedge may be used, in particular, to form and/or maintain the standing wave during the relaxation of the arch or curvature.

Provisions may be made in an advantageous embodiment of the present invention for the plate-like layer to be pressed by means of a pressing device during the formation of the adhering system of layers.

Provisions are made in an advantageous embodiment of the present invention for using a plate made of a transparent material as the plate-like layer. The transparent material may be, for example, glass or plastic. The process described may also be used to form a film layer in the adhering system of layers. A front-side or rear-side cover layer can be prepared by means of the plate-like layer. However, provisions may also be made for forming an intermediate layer for the system of layers, which happens especially when additional process steps will follow for forming layers. The process described may also be used several times during the manufacture of an array of light emitting/light sensing elements in order to prepare a plurality of layers by means of plate-like layers.

Provisions are preferably made in a variant of the present invention for the plate-like layer to be placed on the array of light emitting/light sensing elements with a local arch or curvature not covering the entire plate-like layer, where said local arch or curvature runs over the array of light emitting/light sensing elements, optionally with changing arch/curvature radii, during the relaxation of the plate-like layer. Provisions may also be made in an embodiment for an initial arch to relax simultaneously in two directions in the same form or in a different form. In this embodiment or in other embodiments, the placement of the plate-like layer with the arch or curvature on the array of light emitting/light sensing elements does not preferably mean a direct physical contact between the plate-like layer and the light emitting/light sensing elements, but rather the placement of the plate-like layer on a part of the bonding compound applied, even if a direct contact between the plate-like layer and the array of light emitting/light sensing elements is not ruled out in intermediate steps of the manufacturing process in individual cases in which this is technologically advantageous. However, the system of layers produced is usually characterized in that bonding compound is arranged in a laminar manner between the surface of the light emitting/light sensing elements facing the plate-like layer and the surface of the plate-like layer.

Provisions may be made in an advantageous embodiment of the present invention for using a silicone-based bonding compound as the liquid or paste-like bonding compound.

Provisions may be made in an advantageous embodiment of the present invention for the plate-like layer to be bent during the formation of the arch or curvature and the relaxation thereof with a holding-down device arranged at the edge and with a height-adjustable pressing element.

Provisions are made in a preferred variant of the present invention for a feed of a pressing element along the plate-like layer and an entering motion of a pressing element to be set in a mutually coordinated manner during the formation of the adhering system of layers for the controlled relaxation of the arch or curvature.

In one of the embodiments, the process described may be used in a process for manufacturing a multilayer module with a plurality of light emitting/light sensing elements, especially for producing a multilayer solar module, in which the light emitting/light sensing elements are designed as solar cells. The process for manufacturing the array of layers with light emitting/light sensing elements is then integrated in a global manufacturing process for forming multilayer modules. Process steps employed here additionally are known as such in various embodiments. In connection with solar modules, the manufacturing process now comprises, in one embodiment, the formation of both a front-side cover layer and a rear-side cover layer. The above-described process may be used to manufacture one or both of the cover layers. The cover layer may be manufactured on the front side, for example, by means of a glass or plastic plate. For example, a film material may be used for the rear-side cover layer.

The present invention is shown schematically as an example in the drawings. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 2 is a schematic top view of a solar module;

FIG. 3 is a longitudinal sectional view through a solar module in one of different stages of completion;

FIG. 4 is a longitudinal sectional view through a solar module in another of different stages of completion;

FIG. 18 is a perspective top view of a support of the manufacturing device; and FIG. 19 is a schematic view of the roll-on operation on a support according to FIG. 18 and of a device for manufacturing an array of layers with light emitting/light sensing elements, especially an array of solar cells.

DESCRIPTION OF THE PREFERRED EMBODIMENTS

Figure 1:
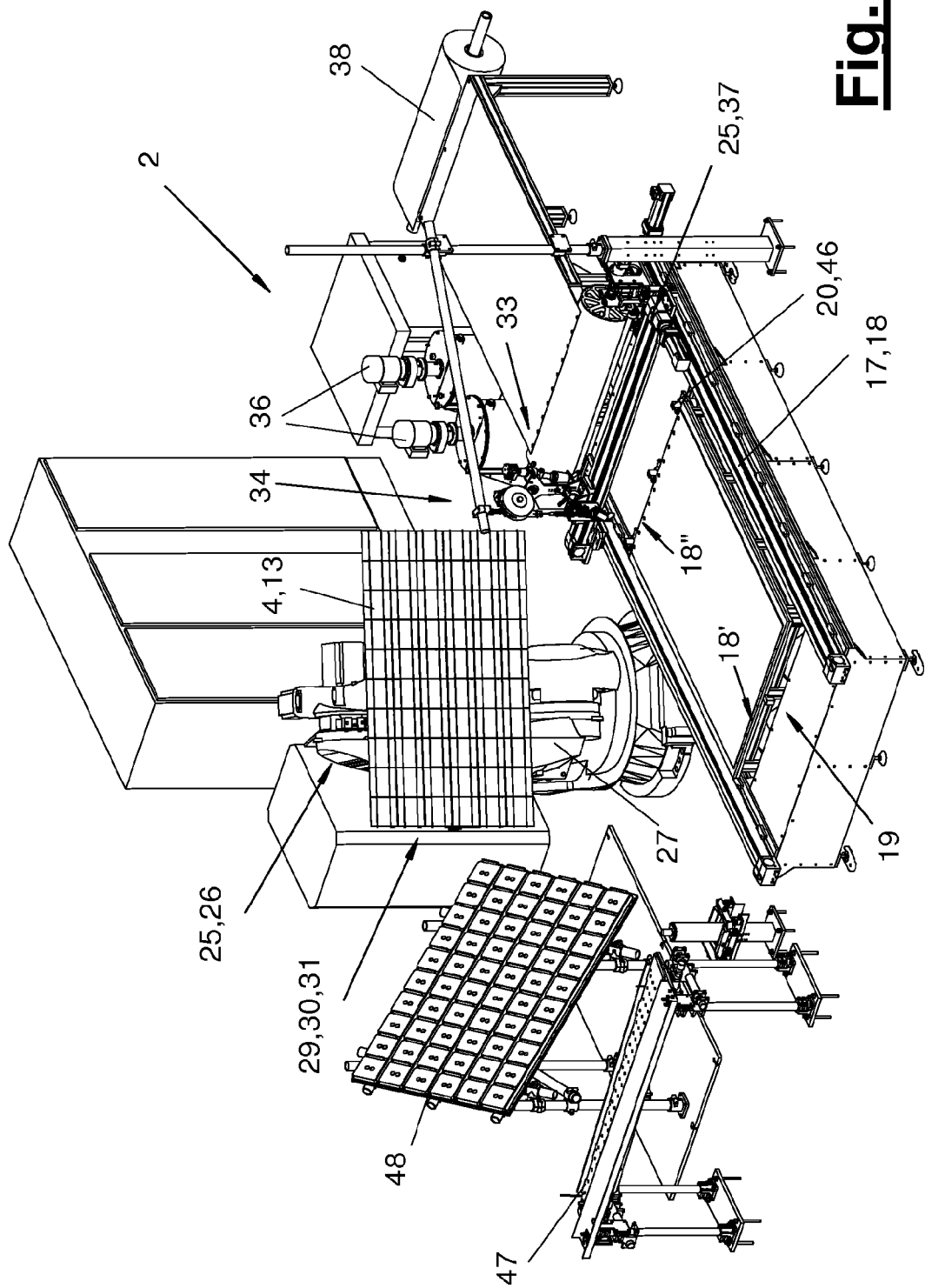
FIG. 1 is a perspective view of a cell-like manufacturing device for a solar module.
Figure 5:
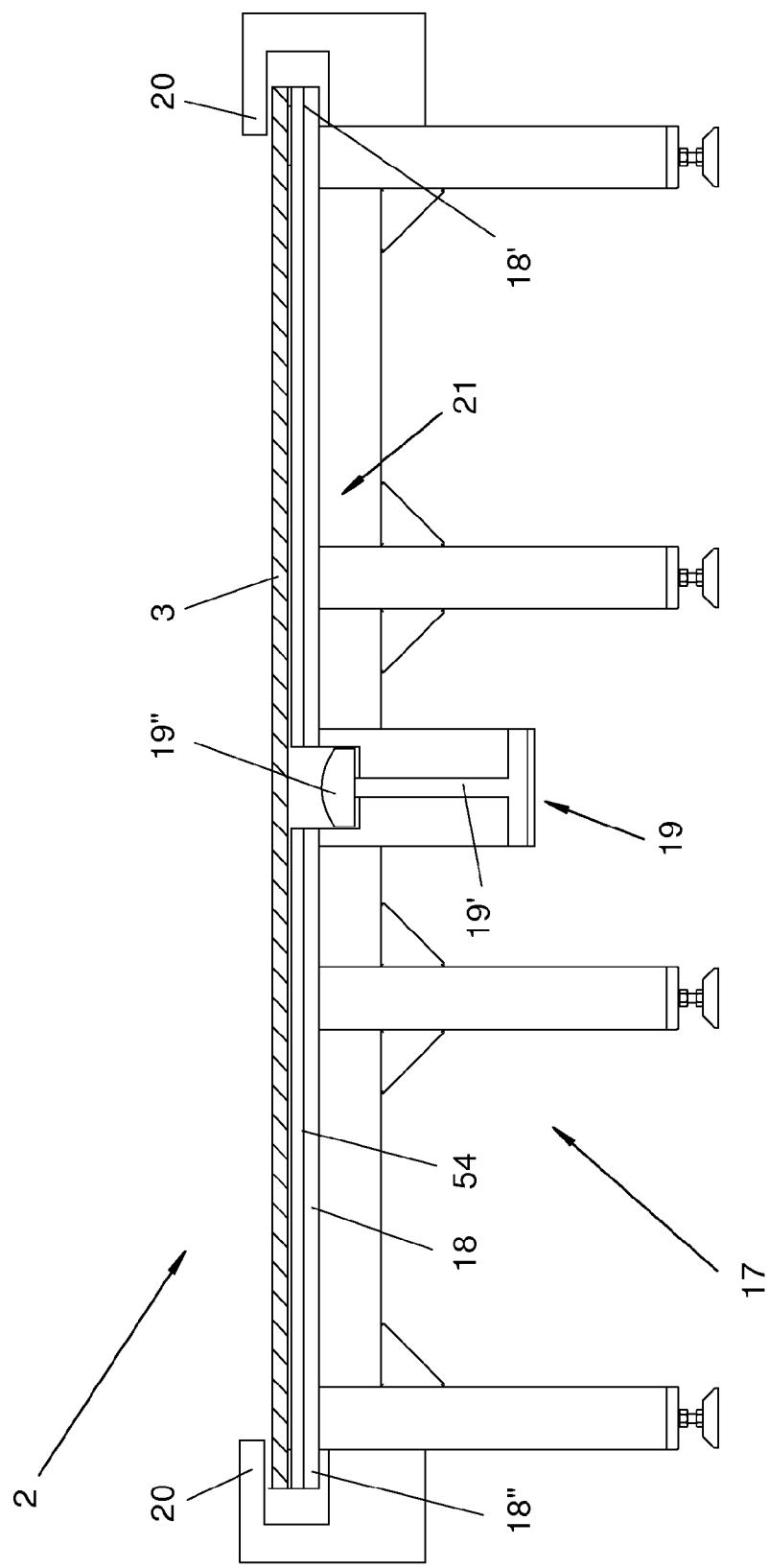
FIG. 5 is a side view of the manufacturing device in one of different process steps.
Figure 6:
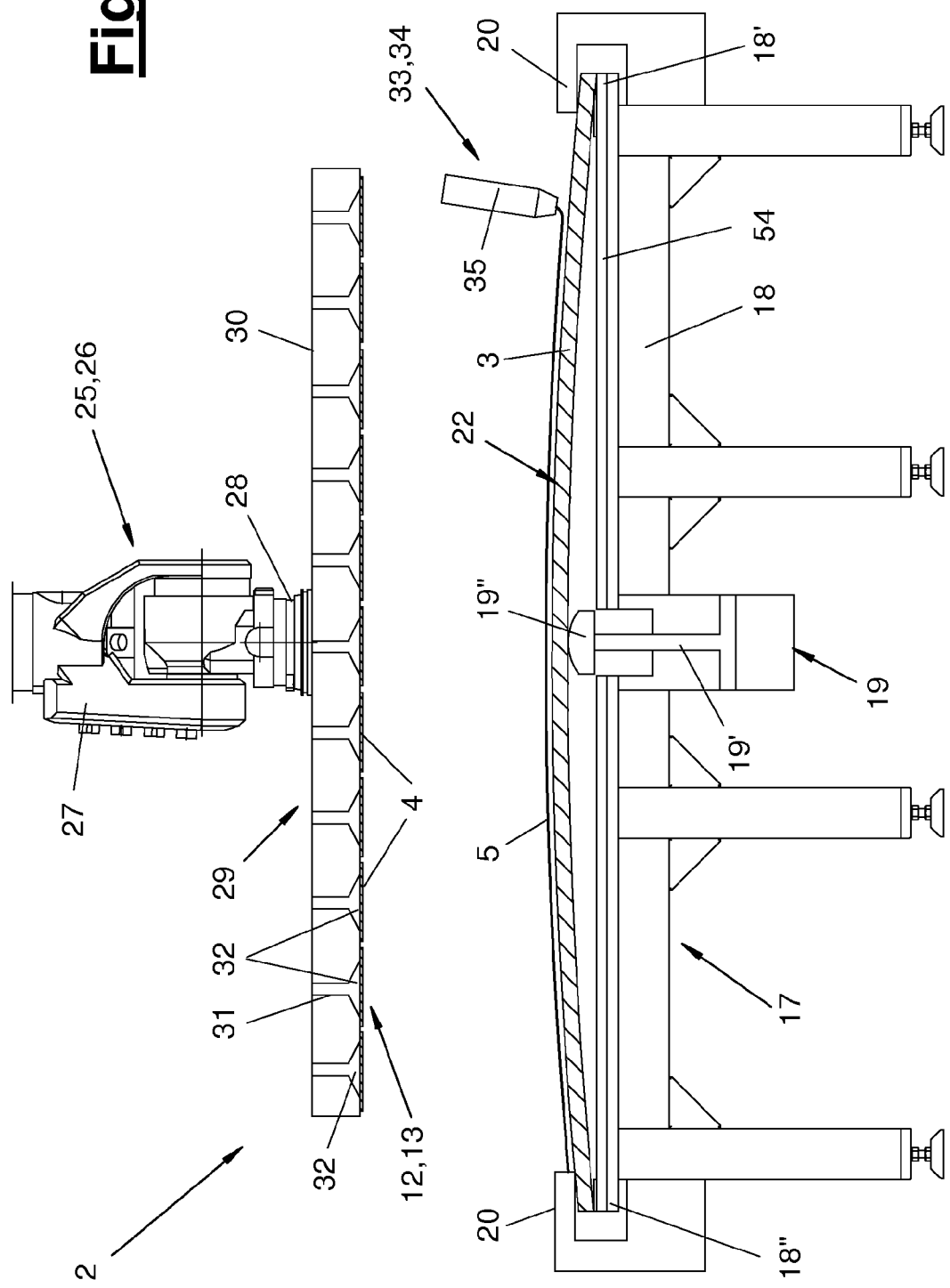
FIG. 6 is a side view of the manufacturing device in another of different process steps.
Figure 7:
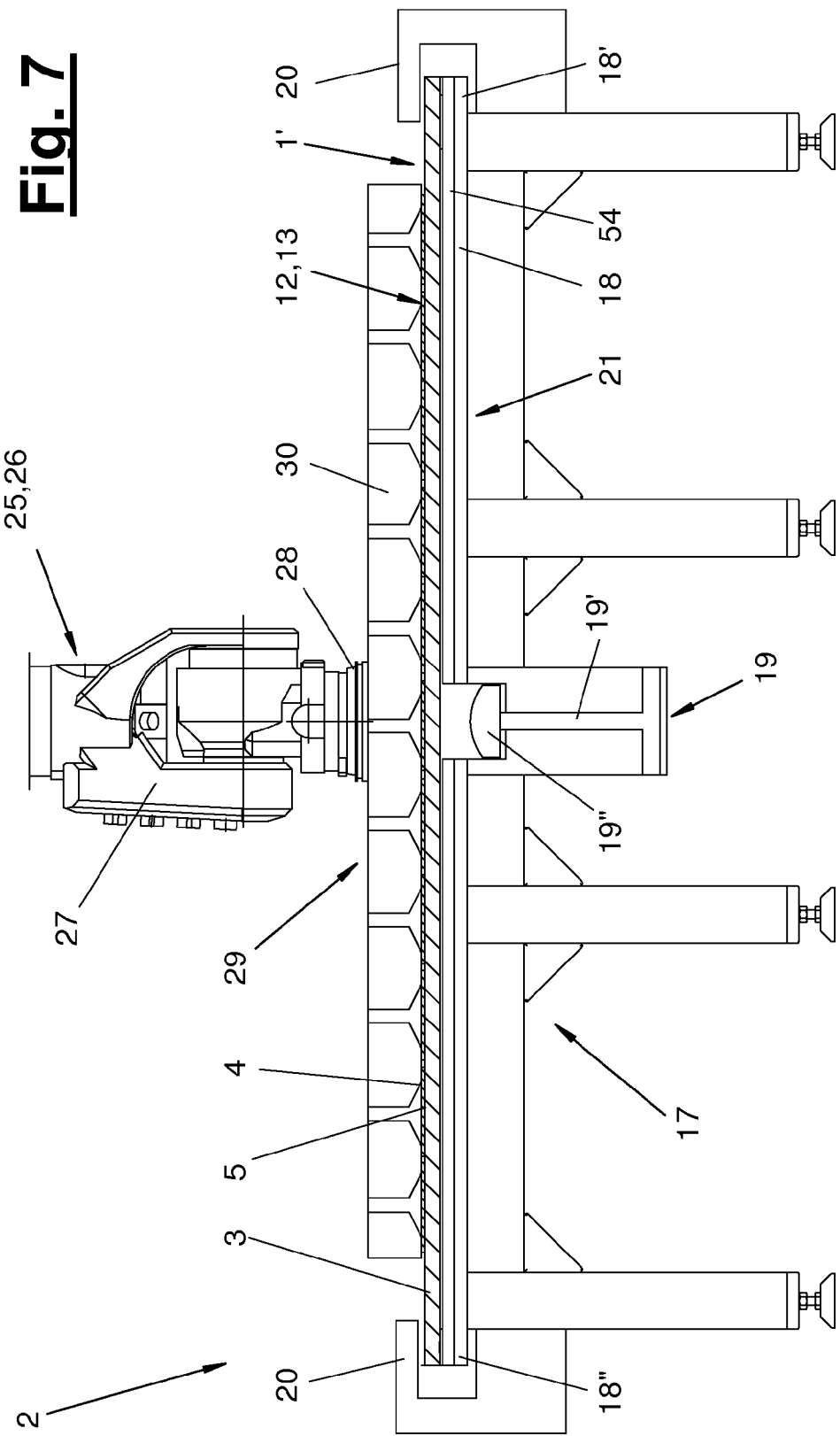
FIG. 7 is a side view of the manufacturing device in another of different process steps.
Figure 8:
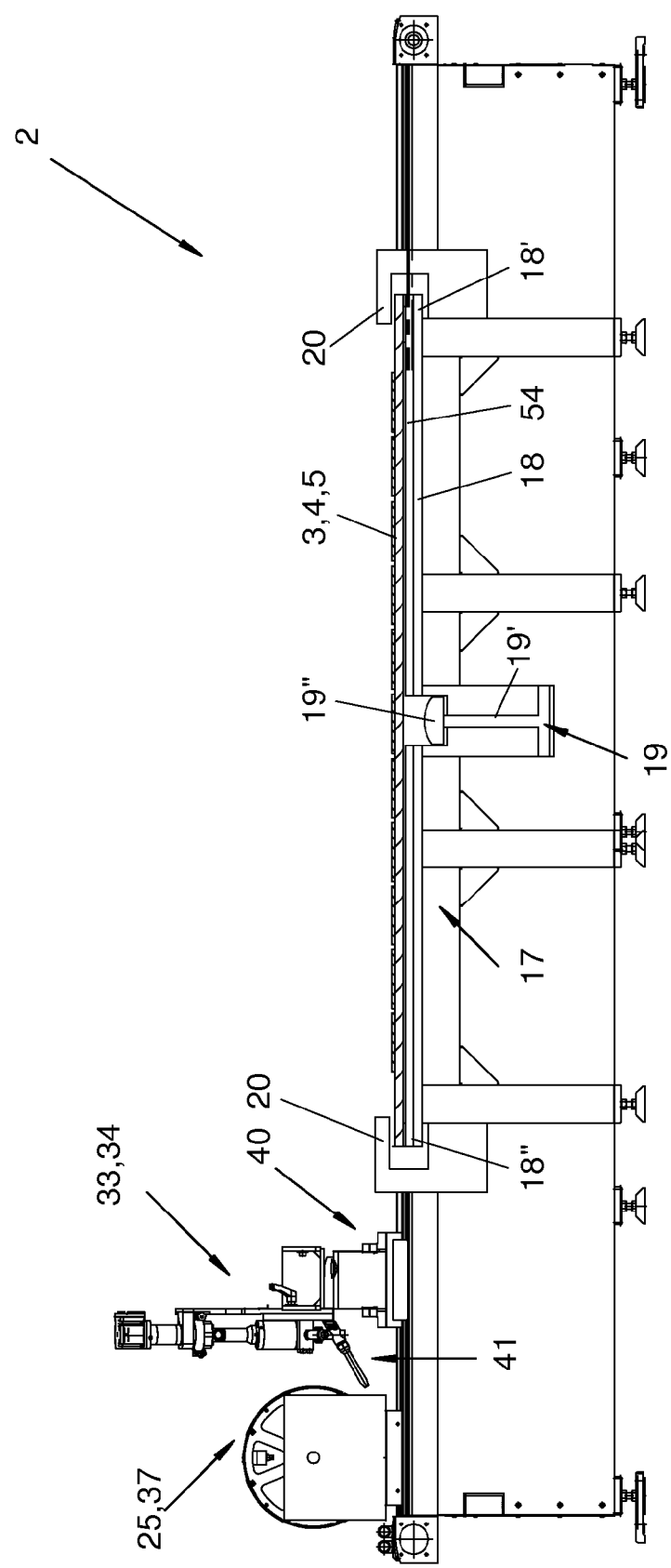
FIG. 8 is a side view of the manufacturing device in another of different process steps.

Referring to the drawings in particular, the present invention pertains to a technology in connection with multilayer modules with light emitting/light sensing elements, especially multilayer solar modules (1). The present invention pertains to a multilayer solar module (1), a multilayer basic component (1') and a manufacturing device (2) as well as a manufacturing process for manufacturing a layer or solar module (1).

Solar module (1) may have various designs and various functions for converting solar energy or other light energy or radiant energy. It may be especially a photovoltaic module for generating current. As an alternative, it may be a hybrid module, which additionally absorbs and utilizes the heat generated during the conversion of radiation. Finally, it may also be a collector module for generating heat. Solar module (1) may have a flat and plate-like shape. As an alternative, it may have another shape, especially an arched shape.

To receive and convert incident solar or radiant energy, solar module (1) has a solar-active element (4), a plurality of which may also be present, and forms a layer within solar module (1). The solar-active element (4) may have various different designs. It may be, e.g., according to FIGS. 3 and 4, a solar cell (8), which has a photoreactive part (10) in the form of a crystalline body made of silicon or the like with electric lines (15) applied on one side or on both sides. In another embodiment, the solar-active element (4) may be a hybrid array (9), which has, on the one hand, the aforementioned photoreactive part (10) with the lines (15) on the light incidence side and, on the other hand, a rear-side thermal part (11) covering a plurality of solar-active elements. This may be e.g., a heat-absorbing layer, which absorbs and possibly dissipates the heat generated in or at the photoreactive part (10). This may happen by heat conduction, by heat exchange with a circulated fluidic medium or in another manner.

Figure 9:
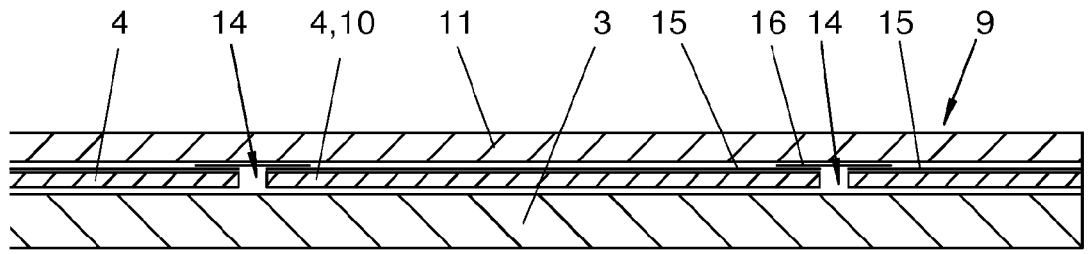
FIG. 9 is a longitudinal sectional view of an alternative design of parts of a solar module.

Solar module (1) has, as a rule, a plurality of solar-active elements (4) arranged next to each other in one layer or one plane. These may be arranged, e.g., in a single row or a so-called string (12) one after another and at mutually spaced locations or with mutual gaps (14). A plurality of strings (12) may form a plane matrix (13) with one another, and lateral spaces or gaps (14) are, in turn, present. The solar-active elements (4) with their electric lines (15) are connected in series one after another within a string (12), the connection being established by suitable sections of line, so-called ribbons (16), which are connected with the lines (15) in a suitable manner, e.g., by soldering. FIGS. 3, 4 and 9 show different embodiment variants for this in a cut-away and enlarged longitudinal section. The strings (12) and their lines (15) are electrically cross-connected with one another at the end and connected to a contact area accessible from the outside. FIG. 2 shows this embodiment of the solar module (1) in a schematic view.

Solar module (1) has a plurality of layers (3, 4, 5, 6, 7) lying one on top of another, which are connected with one another. The layer structure is shown schematically, e.g., in FIG. 4. A transparent and translucent carrier is arranged as a first layer (3) on the light incidence side of solar module (1). Carrier (3) may have the shape of a plate and a strength that determines and stabilizes the shape of the entire solar module (1). It may have a corresponding thickness for this. As an alternative, the thickness and strength may be lower, with another layer/other layers (6) jointly bearing the load. Carrier (3) may consist, e.g., of glass, plastic, especially polycarbonate or the like or another, suitable, transparent material.

The next layer (4) formed by one or more solar-active elements lies on carrier (3). A bonding compound (5), which consists of a transparent material and forms a thin film between the parallel surfaces of the layers (3, 4), is located between these layers (3, 4). Bonding compound (5) ensures bonding or another adhesive connection between the layers (3, 4) and has all-over contact with said layers (3, 4). Bonding compound (5), which likewise forms a layer in the layer structure of the solar module (1), also fills the spaces or gaps (14) between the individual solar-active elements (4) at least partly. It may fill the gaps (14) completely and reach the rearward top side of the solar-active elements (4).

The solar-active elements (4) are embedded in the bonding compound (5) and are surrounded by this with a tight connection on the photoactive side or surface and at the peripheral edges.

Bonding compound (5) is initially elastic and permits the solar-active elements (4) to be embedded. Bonding compound (5) can subsequently solidify, which is possible in different manners. This may be, e.g., solidification due to curing. Curing may take place as hot or cold curing, curing by incident light or radiation or in another manner. Bonding compound (5) has a paste-like or liquid consistency in the initial state during the manufacture of solar module (1). This flowable property makes it possible for the bonding compound (5) to yield and be distributed uniformly as well as to fill out the gaps (14) for embedding the solar-active element or elements (4).

Bonding compound (5) may have various embodiments. It may consist of one component or two, three or more components. In case of two, three or more components, these may react with one another during mixing and lead to curing or solidification of the bonding compound (5) in another manner. In one variant, not shown, bonding compound (5) may also be in the form of a strip or film and have a compressible consistency, which permits said embedding while material is being displaced. Bonding compound (5) may have sticky properties. It may contain especially silicone or silicone-like compounds. Silicone has the advantage of being transparent and resistant to aging.

Carrier (3) with the bonding compound (5) and with the embedded solar-active elements (4) may represent a basic component (1') of solar module (1), which basic component is present equally in different types of modules. The further layer structure and the function of the solar module (1) that possibly results therefrom may vary. Solar module (1) may have especially a rear-side outer cover layer (6), which may be transparent or nontransparent to light. Cover layer (6) may consist, e.g., of a strip, especially a film. As an alternative, it may be plate-shaped and may consist, e.g., of a transparent glass or plastic plate.

A bonding layer (7) may be arranged between cover layer (6) and basic component (1'), especially the rear side of layer (4) with the one or more solar-active elements. This bonding layer may, e.g., likewise consist of a flowable compound and may be, e.g., a plastic. As an alternative, an EVA film or another adhesive or bonding film may be arranged here as well. Bonding layer (7) may consist especially of the same material as bonding compound (5) and ensure together with this a sealed, especially also air-tight, all-round enclosure and bond of the solar-active element or elements (4).

In the embodiment being shown, solar module (1) comprises five layers (3, 4, 5, 6, 7) lying one on top of another. The number of layers may differ from this and may especially be greater. It may also be lower, in which case the bonding compound (5) present as an excess is pressed, e.g., through the gaps (14) and covers the rear side (5) of solar-active layer (4) at least in some areas. Bonding layer (7) may be eliminated as a result.

FIG. 1 and FIGS. 5 through 8 as well as FIGS. 11 through 13 and FIGS. 14 through 18 show a manufacturing device (2) for the above-described solar module (1) in different variants. Manufacturing device (2) may also be used for other embodiments of solar modules (1).

Figure 10:
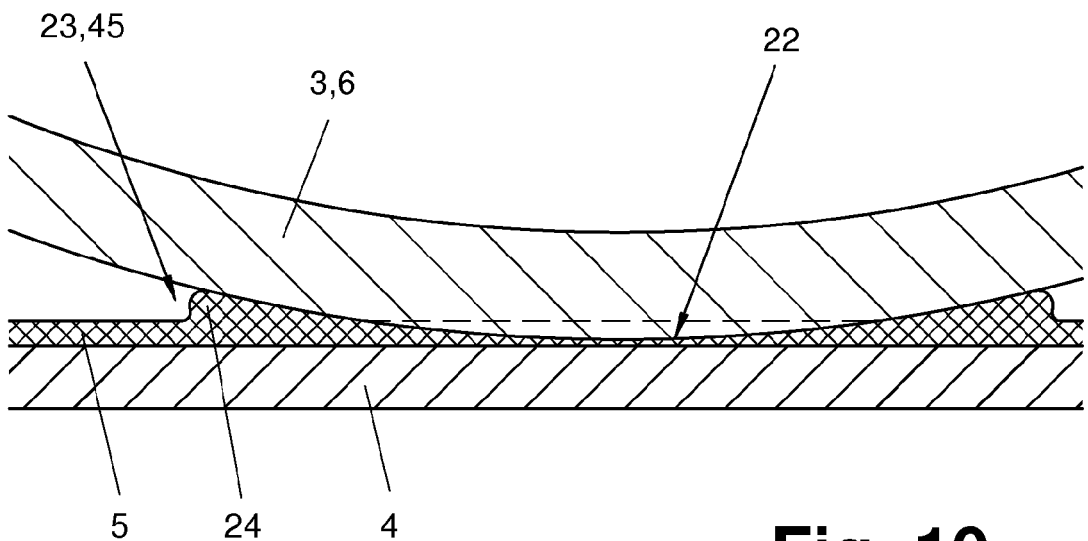
FIG. 10 is a detail view of the arching or rolling effect during the pressing on of adjacent layers and distribution of a bonding compound.

Manufacturing device (2) has a means for forming the multilayer structure of a solar module (1) and a means for applying and uniformly distributing a bonding compound (5). The distribution is supported mechanically by the formation of an arch (22) on at least one of the layers (3, 4, 5) involved in the bonding. Arch (22) is reversible and can be relaxed and has a convex shape directed towards the bonding area. As is illustrated in FIG. 10, e.g., layers (3, 4) with the bonding compound (5) located between them are pressed together, and the arch (22) of one layer (3) will then be gradually eliminated or relaxed and aligned in parallel to the position and orientation of the other layer (4) involved in the bonding. The other layer (4) has a flat position stabilized in a suitable manner in the embodiment being shown. The other layer (3) is gradually also brought into a flat position due to the relaxation of the arch.

Arch (22) is arranged, e.g., centrally on layer (3, 6) and is present only once. It may also be present in a multiple number. When pressing the layers (3, 4) together, the layers will at first approach each other in the vertex area of arch (22), while the bonding compound (5) is compressed or displaced transversely to the axis of curvature here. A bead (24) of the bonding compound (5), which progresses laterally and towards the edge of the module with increasing relaxation, is formed in the wedge (23, 45) formed now by arch (22). Compound is displaced and the bonding compound (5) is distributed at the same time uniformly due to the relaxation of the arch, and due to its rheological characteristics, bonding compound (5) also fills out and seals any vacancies that may be present. In addition, bonding compound (5) can penetrate into the gaps (14) and fill these at least partly. A roll-on operation, by which air or other gas cushions are displaced and removed from the bonding area between the layers (3, 4), also takes place due to the relaxation of the arch. A thin, film-like and closed coating or layer of the bonding compound (5) is obtained at the end between the adjoining layers (3, 4), especially carrier (3) and the solar-active element or elements (4). A stationary or jointly moving lateral limitation, not shown, may prevent a possibly undesired lateral discharge of bonding compound (5) from the wedge area during the relaxation of the arch.

This roll-on and distribution technique with a relaxable arch (22) can also be used for other types of solar modules (1) and other layers. In the embodiments shown, the plate-like layer or carrier (3) is bent and arched, and layer (4) of the solar-active elements assumes a flat position. In another embodiment, not shown, arch (22) may be provided on layer (4) and the solar-active elements, wherein said layer (3) and the transparent carrier assume flat positions. In another variant, both layers (3, 4) may have convex arches (22) facing each other, which are relaxed in a mutually coordinated manner. Furthermore, a single solar-active element (4) or a plurality of solar-active elements (4) may be applied, especially by vapor depositing, on the transparent carrier (3), e.g., in one module variant, not shown, where the above-described manufacturing and bonding technique is used to bond this basic component with a rear-side cover layer via a bonding compound (5) applied in-between. For example, the likewise plate-like cover layer (6) may be arched here and pressed or rolled onto the flat carrier (3). Both carrier and cover layers may also be arched and relaxed in one roll-on and compound distribution operation in another variant. In addition, arch (22) may have another shape and orientation, which does not have to be centrally symmetrical.

Figure 14:
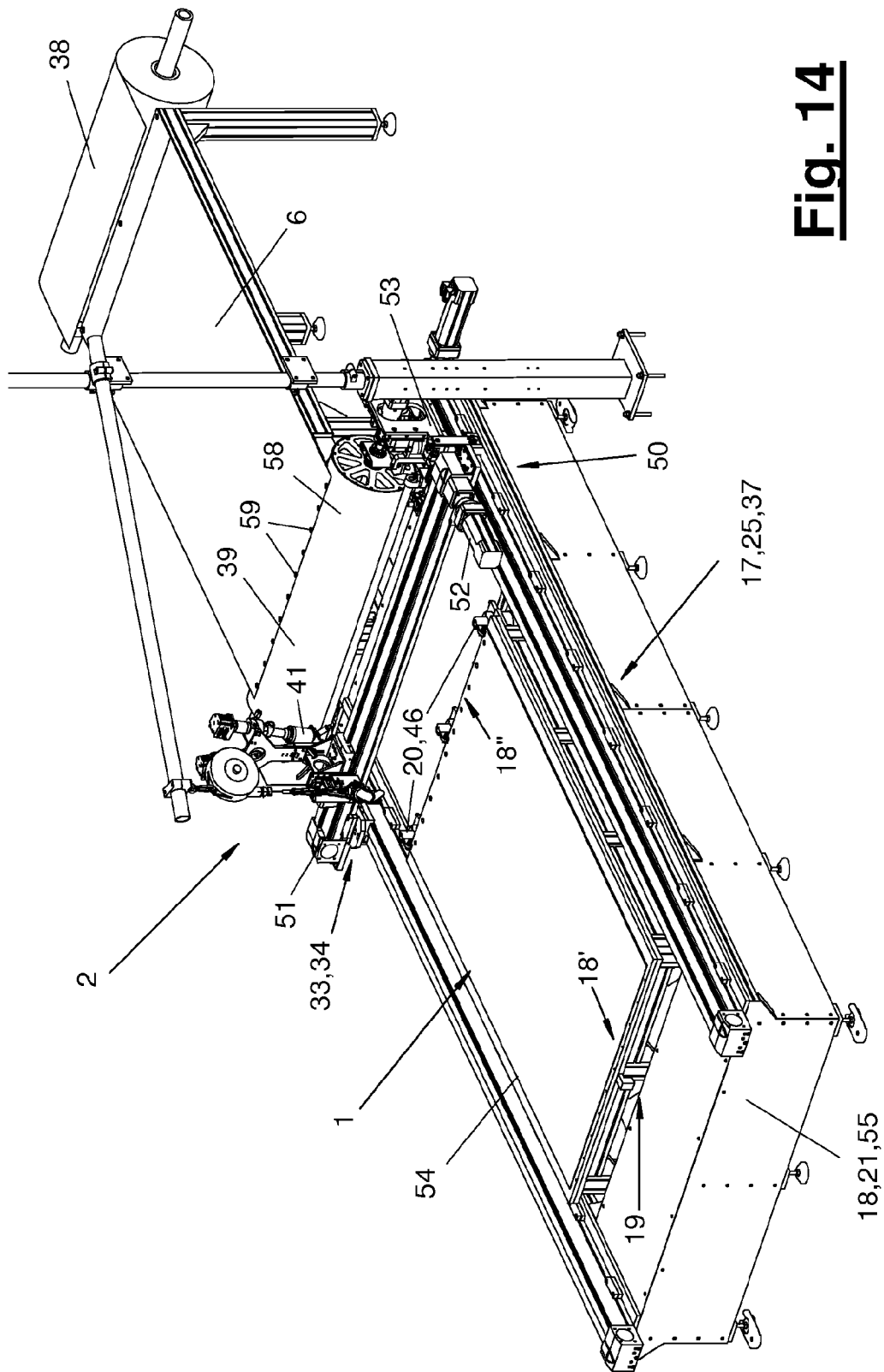
FIG. 14 is an enlarged perspective view of the support and of the arching means of the manufacturing device from FIG. 1.

FIGS. 1 and 14 show a manufacturing device (2) in the form of a manufacturing cell. In one variant, not shown, the cell being shown can be modified into a continuously operating unit with a plurality of stations arranged one after another.

Manufacturing device (2) has a controllable arching means (17) for a layer (3, 4, 6). Arching means (17) may form at least one aforementioned arch (22) in any desired and suitable manner. This may happen especially by bending a plate-like layer (3, 6), in which case arching means (17) is designed as a bending means. Arching means (17) produces the above-described variable and relaxable arch (22) or curvature of a layer (3, 4, 6). Arching means (17) and its function are shown in more detail in FIGS. 5 through 7.

Manufacturing device (2) has, furthermore, an application means (33) for a bonding compound (5, 7). In addition, a pressing device (25) is provided, with which the layers (3, 4, 6) to be bonded are pressed together with the bonding compound (5, 7) located in-between.

Applicator (23) and pressing device (25) may have various designs. In the embodiment shown in FIGS. 5 through 8, pressing device (25) is combined with a handling means (26), which additionally performs feeding and handling tasks to form the layer structure. It may be formed by a pressing element (39) in the other variants.

Handling means (26) may have, e.g., a manipulator (27), which has one or more axes of motion. Manipulator (27) preferably has two or more rotary and/or translatory axes of motion in a suitable configuration and has a three-dimensional work area. In the embodiment shown, an articulated-arm robot with six rotator axes is used, which may be arranged stationarily or movably in one or more auxiliary axes. Industrial robot (27) has a hand (28) with at least one axis of motion, preferably two or more rotator axes of motion. A carrying means (29) is arranged permanently or detachably at hand (28), possible via the intermediary of a change coupling. Carrying means (29) may also be changed if needed.

Feed means for module parts, especially for plate-like carriers (3) and solar-active elements (4), which are handled by means (26) for building up the layers, may be located in the work area of handling means (26). Manufacturing device (2) may have, for example, a string deposit site (47), on which strings (12) are fed from an external production site. Handling means (26) can pick up the strings (12) with carrying means (29) and bring them to a matrix deposit site (48), at which matrix (13) is built up gradually from a plurality of strings (12).

Matrix formation may also take place in another manner and by other means. Handling means (26) picks up the matrices (13) with carrying means (29) and places them on the layer (3) positioned at the arching means (17) before, especially in the form of a plate-like carrier (3). Feeding of layer (3) may likewise be brought about by handling means (26) in a preceding or subsequent process step.

Carrying means (29) has, e.g., a carrying plate (30) with a flat functional surface, which consists of a material that is inert for the bonding compound (5), e.g., Teflon or the like. A plurality of gripping elements (31), which are adapted to the handling of the respective layers (3, 4, 6) and parts thereof, are arranged at carrying plate (30).

In the exemplary embodiment shown in FIGS. 5 through 8, gripping elements (31) are designed as suction units, which have a suction opening (32) each on their front-side surface. The suction openings (32) may be present and arranged in the same number and distribution as the solar-active elements (4) in string (12) or in matrix (13) and grasp these elements (4) preferably centrally. One or more suction openings (32) may be present per element (4). Suction units (31) may be switchable and their suction performance and holding force may also optionally be controllable. Gaps (14) are bridged over by the rear-side carrying plate (30), and depressed grooves and/or other openings may optionally be present here in the plate surface for receiving possible surpluses of the bonding compound (5).

Arching means (17) has a support (18) for layer (3) with an adjustable pressing element (19), which is a central pressing element in the exemplary embodiment in FIGS. 5 through 8, and with a holding-down device (20) arranged at the edge. Support (18) may be designed, e.g., as a flat depositing table. It may also contain a heating means (21), which is not shown specifically for the sake of clarity. Pressing element (19) is designed, e.g., as a plunger (19') that can be extended vertically or at right angles to the support surface with a suitable drive and a plunger head (19") with a rounded surface. The holding-down devices (20) are arranged, e.g., at mutually opposite edges (18', 18") of the support and are designed as clamps arranged at the edge with feeding drives. They fix the edge of the layer or carrier against the extending plunger (19'). Carrier (3) obtains the arch (22) shown, e.g., due to the central pressing element (19). Arch (22) can be relaxed due to the controllable drive of the pressing element or plunger (19, 19'). The drive may be, e.g., a cylinder, a motor with gear mechanism or the like. Handling means (26) acts as a pressing device (25) and presses with the carrying plate (30) the layer (4) or the one or more solar-active elements from the top onto the arched carrier surface and the bonding compound (5) applied there in advance. The above-described rolling and bonding operation takes place due to relaxation of arch (22) and corresponding adjustment of the carrying means (29) and of layer (4), with the bonded layers (3, 4, 5) assuming the flat position shown in FIG. 7 at the end and pressing element (19) is withdrawn.

In the embodiment shown, applicator (33) applies a flowable and, e.g., paste-like bonding compound (5), especially a silicone compound, to the layer and carrier (3). This may happen with the carrier (3) being in the flat position or arched. Applicator (33) has one or more reservoirs (36) for the bonding compound (5) or for the individual components thereof in case a mixture is formed. Furthermore, a dispensing device (34) is present, which determines the quantity of bonding compound (5) discharged and the distribution of bonding compound (5) on layer (3). Dispensing means (34) may have one or more nozzles (35) for applying the compound. These can be moved by means of a suitable handling and moving means along one or more, especially two axes of motion relative to layer (3).

The compound may be applied in strips or beads, with the relaxation of the arch ensuring the displacement and distribution of the bead material. In a modified embodiment, a compound can be applied with a doctor or the like, while an extensively homogeneous layer (5) of bonding compound is formed. In another variant, not shown, applicator (33) can apply a compressible film or another type of contiguous strip of compound to layer (3).

The application of additional layers (6, 7) to the basic component (1') of solar module (1) may be carried out in any desired and suitable manner. For example, a bonding film (7) and subsequently a plate-like cover layer (6) can be applied by handling means (26).

Figure 11:
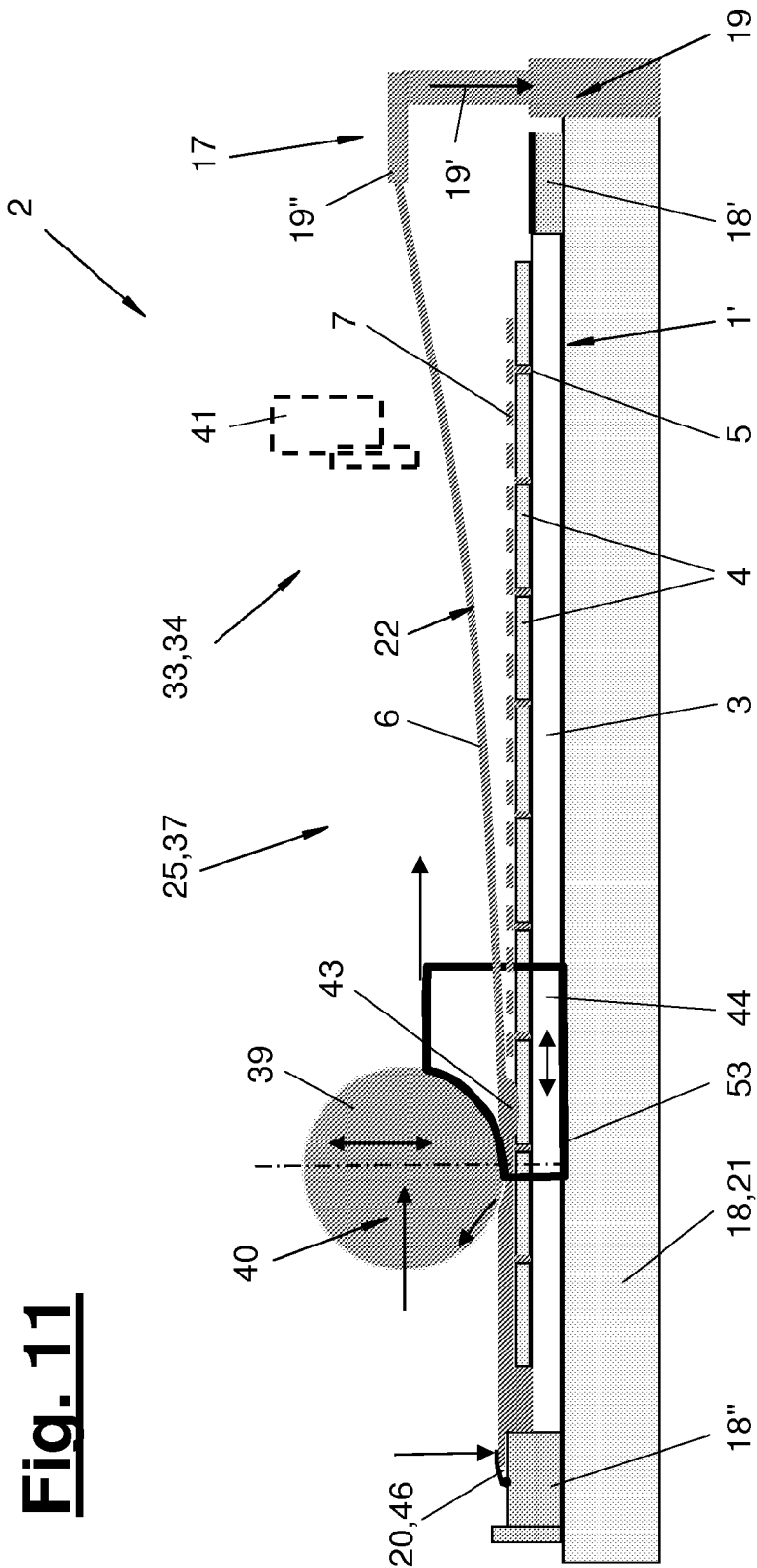
FIG. 11 is a side view showing a variant of the manufacturing device with an applicator for rear-side layers of the solar module.
Figure 12:
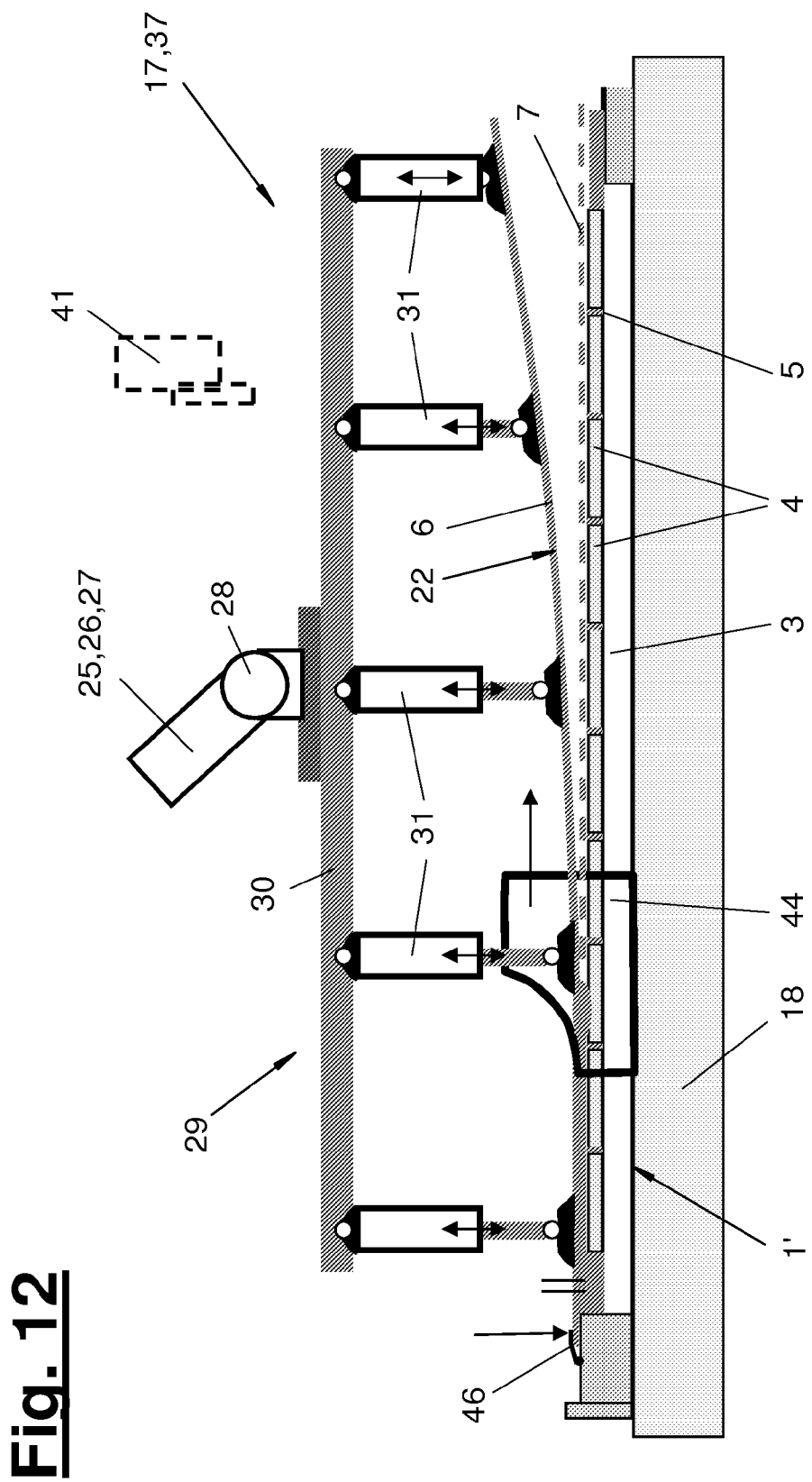
FIG. 12 is a side view showing another variant of the manufacturing device with an applicator for rear-side layers of the solar module.
Figure 13:
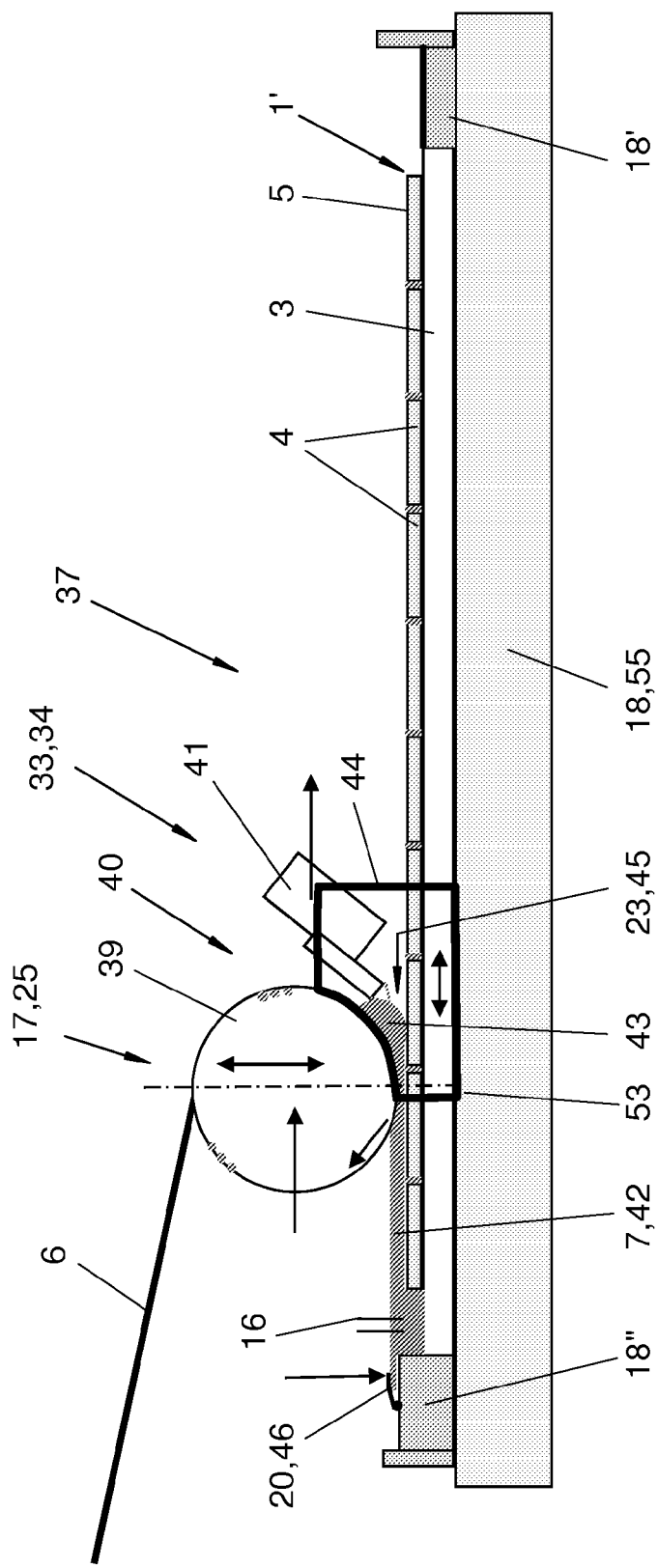
FIG. 13 is a side view showing another variant of the manufacturing device with an applicator for rear-side layers of the solar module.

FIGS. 11 through 13 show an applicator (37) used for this purpose, with which a plate-like or film-like cover layer (6) is applied to basic component (1') and to the reverse side of layer (4).

A plate-like cover layer (6) that can be arched and bent and consists of glass, plastic or another suitable material, is applied in the embodiment according to FIG. 11. A bonding compound (7), e.g., a paste-like adhesive (42), is applied first to the top side or reverse side of layer (4) of the solar-active elements by means of a dispensing system (41). This may have been carried out in advance by a laminar application, by means of beads or the like or even in another manner. Cover layer (6) is then placed on, which may be carried out by handling means (26) according to the above-described exemplary embodiments. The ribbons (16) may have been passed through cover layer (6) before. A variant of an arching means (17), with which cover layer (6) is imparted an arch (22), may possibly be used for this application of cover layer (6). Arching means (17) may have a fixing means (46) for fixation at an edge area (18") of support (18), which fixes one end of the one edge of the cover layer (6). Fixing means (46) may be designed like a holding-down device (20). A pressing element (19) arranged at the other edge area (18') of the support (18) may be positioned at the opposite end or edge of cover layer (6) and comprise a plunger (19'), which can be extended vertically or at right angles to the support surface, and a plunger head (19") or the like, on which the edge of the layer lies. The edge of the layer is raised by means of this and arch (22) is bent starting from the fixed (46) edge. Fixing means (46) and pressing element (19) act on opposite areas of the layer, especially on the top side and the underside. Pressing element (19) may be of another design as an alternative and may produce tensile forces instead of pressing forces.

Applicator (37) and arching device (17) also have in this case a pressing element (39), which acts on the rear side of cover layer (6) and is designed, e.g., as a rotatably and possibly rotatingly driven roller. By means of a moving means (40), pressing element (39) can be moved from the fixed edge of the layer and from the edge area (18") along support (18) and cover layer (6) towards the other edge area (18') also pressed at the same time against the back of the layer. The relaxation of the cover layer (6) takes place due to feed of pressing element (39) and a retracting motion of pressing element or plunger (19, 19') coordinated therewith. A lateral limitation (44), e.g., in the form of lateral shields (44) being moved along pressing element (39), can limit the displacement of adhesive.

In a variant of the embodiment shown, dispensing means (41) can be moved along and introduce the material of the bonding layer (7) into a wedge (23, 45) between cover layer (6) and layer (4) in the rolling area.

Bonding layer (7) may be designed and applied in a manner corresponding to the above-described bonding compound (5). This may be a silicone-based adhesive compound. It may be translucent and possibly transparent, but this is not absolutely necessary. Dispensing means (41) may be present in addition to dispensing means (34) or may be formed by same.

A bendable and plate-like cover layer (6) is likewise applied to basic component (1') in the variant according to FIG. 12, and an arching means (17) is used as well. This is designed in the variant to FIG. 11 as a flexible carrying means (29) and is held on the hand (28) of a handling means (26), especially a multiaxial manipulator or robot of the above-described type. Carrying means (29) has a rigid carrying plate (30) here with adjustable gripping elements (31) arranged thereon, whose suction or action side can change the distance from carrying plate (30) by means of extensible plungers or the like. Depending on the length of extension, a different gripping contour is obtained hereby, which is used to form the arch (22) shown. To relax arch (22) and cover layer (6), gripping elements (31) are extended in a controlled manner. One edge of the layer is held by a fixing means (46), possibly on the support, in this case as well. A lateral limitation (44) may be arranged stationarily or moved along coordinated with the relaxation or the gripper actuation. The arching means (17) shown in FIGS. 11 and 12 is suitable not only for the applicator (37) and cover layer (6). According to FIGS. 14 through 18, it can also be used for layers (3, 4) as a variant of the above-described exemplary embodiments.

In another variant of the embodiment variant according to FIGS. 11 and 12, cover layer (6) may have a higher flexural elasticity and possibly a smaller thickness, and it is designed, e.g., as a film blank or the like.

FIG. 13 shows a third variant for applying a flexurally elastic cover layer (6), which is especially in the form of a film, by means of a paste-like bonding layer (7) designed as an adhesive, to basic component (1') and the reverse side of layer (4). Cover layer (6) is fed, e.g., from a film roll (38) and fixed by means of a fixing means (46) at one edge of carrier (3) or of solar module (1). The ribbons (16) may have been passed through cover layer (6) in advance. Cover layer (6) is fed by means of a pressing element (39) moved over basic component (1') by means of a moving means (40) and pressed on. Pressing element (39) may be a doctor or a rotating roller, which produces a roll-on effect. A flowable adhesive (42) is introduced in a previous application or into the roller wedge (45) by means of a dispensing means (41), and this adhesive forms a bead (43) here and is distributed uniformly on layer (4). A lateral limitation (44), e.g., in the form of lateral shields (44) moved along with pressing element (39), can limit the displacement of adhesive. Roller (39) may have a controllable rotary drive and may contain, besides, a suction means, which is symbolized by suction openings shown schematically on the roller jacket. Moving means (40) also ensures vertical pressing of cover layer (6) and conveying of the roller in the longitudinal or feed direction with the use of a carriage or another, suitable advancing means.

The rolling and application technique shown in FIG. 13 may also be used to form flexible basic components (1') in a variant to FIGS. 1 through 7. A carrier layer (3) of a flexurally elastic, film-like design, which is translucent or transparent is applied here to a layer (4) of solar-active elements on the front side by means of a bonding compound (5).

The other layers (3, 4, 6) are bonded permanently and mutually by the bonding layers (5, 7). In addition, thermal baking may be carried out in a laminator or the like. The flowable compounds (5, 6) may also ensure tight sealing at the edge of the module and possibly trimmed here.

Heating means (21) may be used to solidify the bonding compound (4) after the application thereof and to solidify the system of layers. It may be controlled and its output may possibly be varied as well. It may be used especially to heat the bonding compound (5) applied and to improve the flowability and distribution thereof. The output can be reduced now. The heating output may be increased for the subsequent solidification and especially hot curing. Heating means (21) may likewise be used for the subsequent solidification or curing of bonding layer (7) as well.

The finished solar module (1) can be subsequently removed from handling means (26). Handling means (26) may, furthermore, perform additional functions. On the one hand, it can be used to receive and test string (12) at a suitable optical testing device with application of voltage to string (12). It may possibly also be used to establish the electric line connections by, e.g., an integrated soldering means being present, with which the ribbons (16) are soldered to the rear-side lines (15) or the lines (15) of string (12) are cross-connected with one another and soldered. Welding is also possible instead of soldering or another connection technique.

FIGS. 14 through 18 show a variant of manufacturing device (2) and of the manufacturing process compared to the embodiment according to FIGS. 5 through 8. The modifications pertain especially to support (18) and arching means (17) as well as the layer structure.

The manufacturing process may be carried out, as in the above-described exemplary embodiments, within a single station by means of a single and preferably stationary support (18). Arching means (17) has a pressing element (19), which is arranged at an edge area (18') of support plate (54) in this embodiment. A hold-down device (20) or a fixing means (46) is located at another and especially opposite edge area (18"). This arrangement corresponds to the above-described embodiment according to FIG. 11, and pressing element (39) with moving means (40) and application means (33) as well as dispensing means (34, 41) may also be designed in a corresponding manner.

At least one solar-active element (4), preferably a string or a matrix of solar cells, which are already provided with connecting electrical lines (15) or ribbons (16), is placed on support plate (54) in the variant according to FIGS. 14 through 18. This may be brought about by the above-described handling means (26) and carrying means (29). The lines (15) or ribbons (16) point downward towards support plate (54) in this case. Support plate (54) has a guide (57) for the solar-active element (4), which can be positioned accurately by means of this. Guide (57) may comprise, e.g., a network of grooves, which correspond to the shape of the lines (15) and receive these in a positive-locking manner or with an oversize. Support plate (54) may have a functional surface (61) that is flat aside from guide (57) and consists of a non-adhering material that is inert for the bonding compound (5), e.g., Teflon or the like.

The solar cells (8) may lie flat on the flat surface or support areas (60) between the grooves. As an alternative, they may be accommodated in shell-like impressions, which may be part of guide (57).

In addition, a suction means (55), which has a plurality of suction openings (56) on the surface (61) of support plate (54), is arranged in support (18). These suction openings may be arranged in the area of guide (57) and especially next to it in the respective support area (60) of the solar cells (8). Suction means (55) draws in the solar cells (8) and can also act in the free areas (14) located between them.

At least in the support area (60) of the solar cells (8), support plate (54) may have a profiled plate surface (61), which makes it possible to draw air from the free areas (14) under the edge area (64) of the solar cells (8). The profiling may be formed by a corresponding surface roughness of the plate surface (61) or in another manner. A plurality of small air ducts (62) are formed between solar cell (8) and its support area (60), especially in plate surface (61), for the passage of an air flow (63) from the edge (64) of the solar cell to a suction opening (56). A bonding compound (5, 7) present in the free space (14) can likewise be drawn in at the cell edge (64) and possibly drawn into the air ducts (62) a short distance, while it can extend behind the cell edge (64), as in the exemplary embodiment according to FIGS. 11 through 13.

Suction means (55) may be controllable and connected for this purpose with the station control, especially the robot control. The suction capacity and/or suction direction of the suction openings (56) at the plate surface (61) may be able to be controlled separately from one another. In particular, the direction of flow can be reversed in order to make it possible to remove the bonded layers (3, 5) more easily.

The sequence of layer formation (4, 5, 3) is transposed in this exemplary embodiment compared to the above-described example, The solar-active layer (4) is placed first on support (18) or support plate (54) and this is joined on top by the transparent bonding layer (5) and the possibly translucent plate-like layer or carrier (3) are then applied.

The embodiment of manufacturing device (2) and of the cell may be essentially the same as in FIG. 1. Applicator (33) has a conveying means (50) for a dispensing means (34, 41) in this embodiment as well. A guide (51), which is designed, e.g., as a monoaxially movable carriage or as a biaxially movable cross slide, which is displaceable on rails along support (18) and possibly on a slide bar at right angles thereto with one or more drives (52) from one edge area (18") to the other edge area (18'), may be provided for this for moving the dispensing means (41) monoaxially or multiaxially relative to the solar-active element (4). Applicator (33) applies a paste-like or liquid or possibly also compressible, film-like bonding compound (5) to the deposited solar-active element (33), which may be carried out by a laminar application or in the form of a meandering bead.

Arching means (17) has a pressing element (39), which can be moved along support (18) by means of a moving means (40) and which may have a dual function as a pressing means (25) and as an additional applicator (37) for a cover layer (6).

Figure 15:
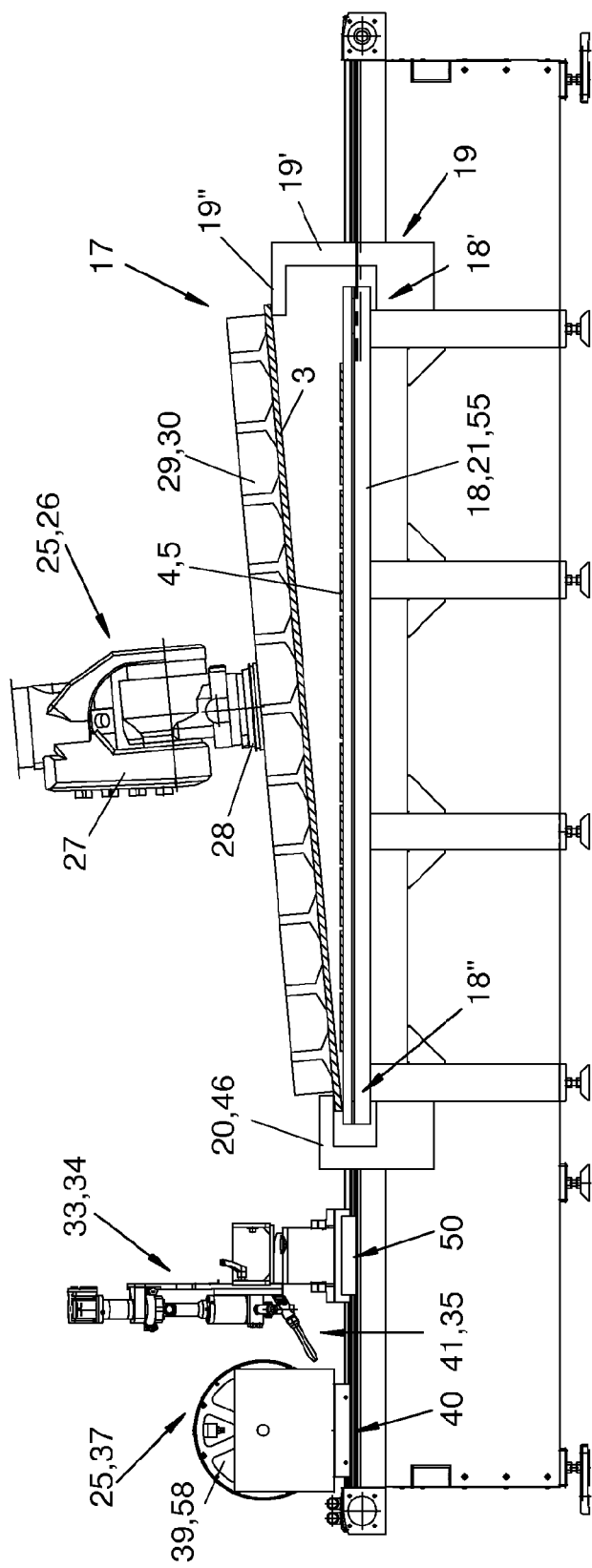
FIG. 15 is a side view of the manufacturing device from FIG. 1 in connection with another layer structure.

According to FIG. 15, handling means (26) feeds a plate-like layer (3), especially a translucent glass or plastic plate, to support (18) with the carrying means (29) and a possible replaceable carrying plate (30) adaptable to the corresponding layer and transfers it to the arching means (17). This may happen with the pressing element (19) retracted or extended. Plate-like layer (3) is placed at least with one edge at the edge area (18") of support (18) at the support plate (54) or on one of the layers (4, 5) applied before and fixed with a controllable fixing means (46) or a holding-down device (20). The other, opposite edge area of layer (3) is placed on plunger head (19"). FIG. 15 shows plunger head (19") in an already extended position for better distinction of the individual parts of the device. The depositing preferably takes place on a withdrawn plunger head (19"), which extends after separating the handling means (26) and the carrying means (29) and bends the plate-like layer (3) in the manner described previously in connection with FIG. 11 and produces the arch (22) thereof.

Pressing element (39), which is preferably designed as a rotatably and optionally driven roller, is then moved towards edge area (18') in the above-described manner along the arched plate-like layer (3) and presses same onto bonding layer (5), and pressing element (19) is lowered at the same time by a motion coordinated with the roller feed.

The basic component (1') formed hereby with the layers (3, 4, 5) is then turned by handling means (26) and provided with a cover layer (6) as well as optionally with another bonding layer (7). This may again happen in the manner shown in FIG. 11, 12 or 13. The one or more bonding layers (5, 7) may be solidified and especially cured in the above-described manner. This may happen especially by means of a heating means (21) integrated in support (18).

The finished multilayer solar module (1) can then be removed from handling means (26), after which the manufacturing cycle begins anew. To shorten the set-up and transport times, handling means (26) may comprise a plurality of robots (27). It may optionally also serve a plurality of supports (18), which are coated with the layers (3, 4, 5, 6, 7) in a staggered manner in time.

In a variant of the above-described embodiment according to FIGS. 14 through 18, the layer structure may be changed and a bonding compound (7) and a cover layer (6) may be applied in the manner described to a solar-active element (4) placed on support plate (54).

Figure 16:
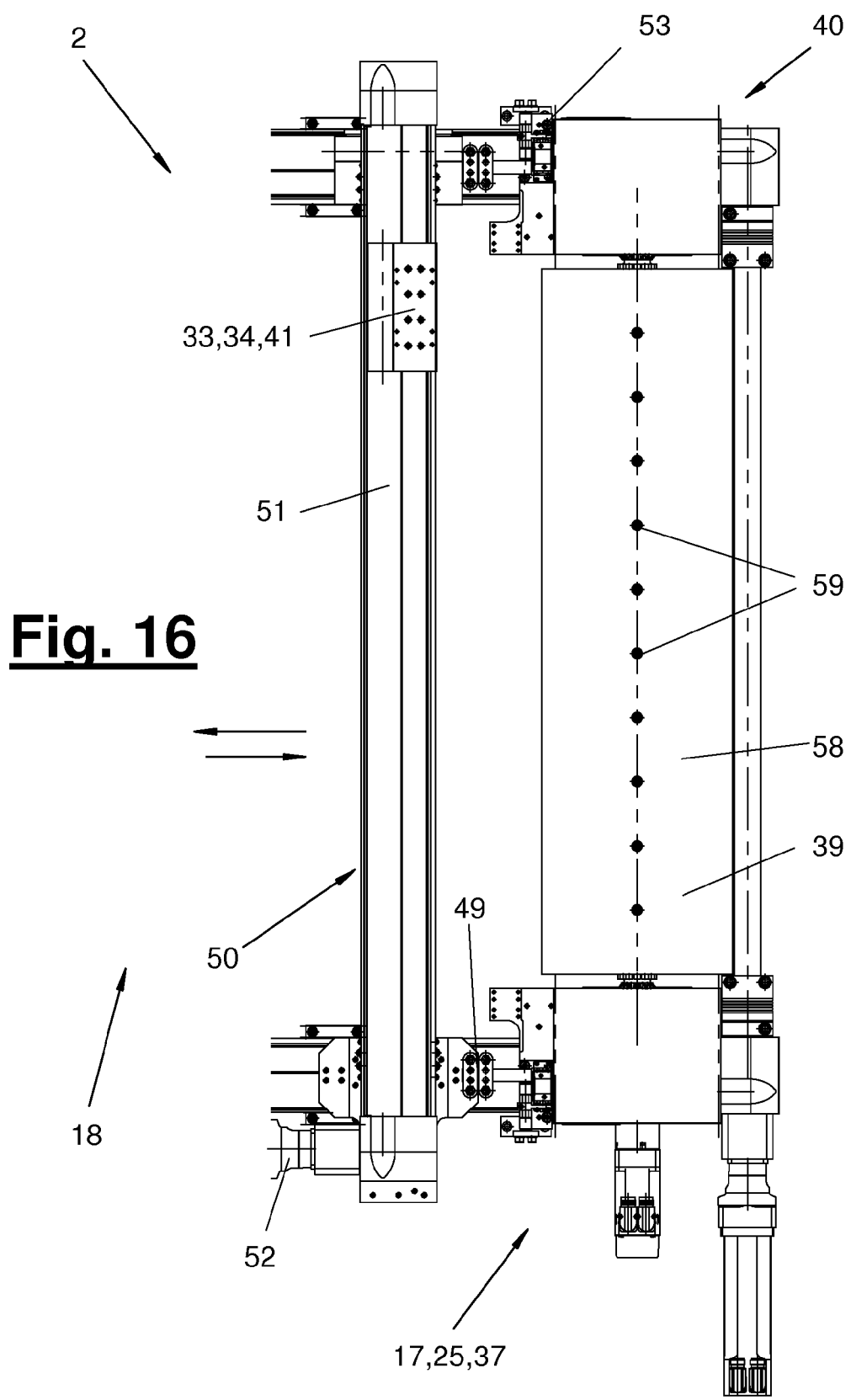
FIG. 16 is a top view of an applicator and of a pressing element.
Figure 17:
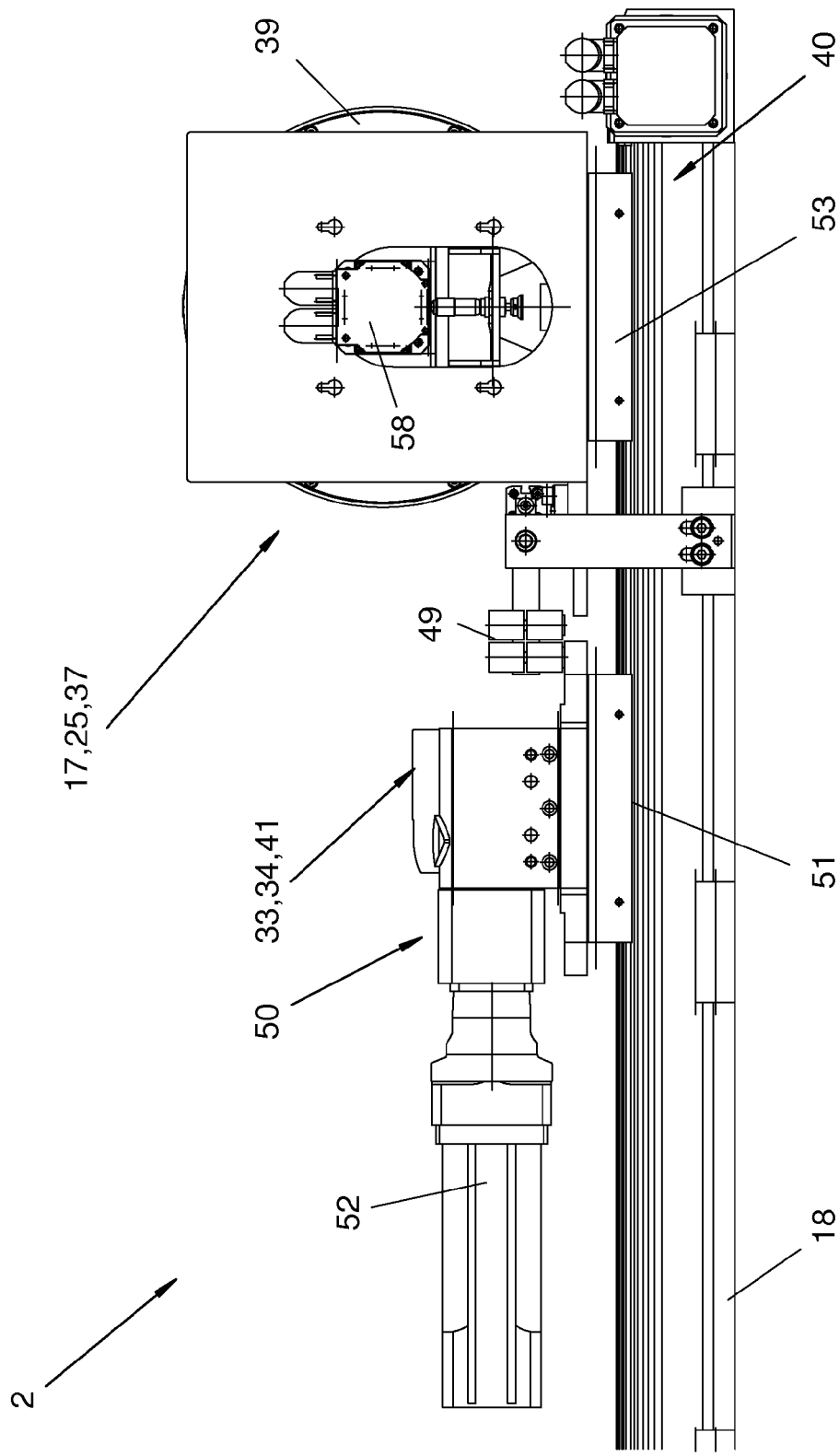
FIG. 17 is a side view of an applicator and of a pressing element.

FIGS. 16 and 17 show details of a design of moving means (40) and conveying means (50) for the applicator (33). These can be coupled and moved individually or together. A controllable coupling (49), which may optionally be present in a plurality, may be present for coupling and connection. An individual drive (52) is sufficient in such a coupling for the travel motion along support (18), and this drive (52) is arranged, e.g., at conveying means (50). Pressing element (39) is carried along in the coupled state, and a defined distance is established at the same time. According to FIGS. 1 and 14, the unit may be positioned behind and outside the support plate (54) during the depositing of the plate-like layer (3) and the formation of arch (22).

FIG. 19 shows a schematic view to explain the above-mentioned embodiment of a device and of a process for manufacturing an array of layers with light emitting/light sensing elements, especially solar cells (8), for a multilayer module.

The solar cells (8) are arranged on support (18), with which a working plate or work surface is formed. The suction openings (56), some or all of which are connected to a compressed air control system, not shown, are formed in the support. The suction openings (56) are prepared in an array extending in the x and y directions of support (18).

FIG. 19 shows the process of relaxing a plate-like layer (6) over the array of solar cells (8). Arch (22) extends from left to right over the array of solar cells (8) such that the arched plate-like layer (6) finally relaxes on the array of solar cells (8). A standing wave (65) in the form of a bead (24) extends in wedge (23) in this process over the array of solar cells (8). The incorporation of the liquid or paste-like bonding compound (7) into interspaces (14) between the solar cells (8) is supported in the above-mentioned manner by vacuum being admitted to the suction openings (56) during the relaxation of the plate-like layer (6). The air is drawn off from the interspaces (14) in this manner, which is schematically indicated in FIG. 19 by means of arrows. At the same time, the suction openings (56), to which the suction pressure is admitted, prevent bubbles from forming in the bonding compound (7) embedding the solar cells (8). Inclusions of air possibly formed during the incorporation of the bonding compound are also resolved by means of the vacuum.

It appears from FIG. 19 that the bonding compound (7) will also be drawn into an area (66) between support (18) and the solar cells (8) around edges (64) of the solar cells (8) based on the suction pressure. Edge or border areas (64) of the solar cells (8) are likewise embedded in the bonding compound (7) in this manner.

When the system of layers is prepared from the array of solar cells (8), bonding compound (7) and plate-like layer (6), the plate-like layer is consequently relaxed completely and has passed over into a flat shape, overpressure can be admitted to the suction openings (56) in order to support separation of the system of layers prepared from support (18).

Provisions may be made in case of vacuum and in case of overpressure alike for admitting different pressures to the suction openings (56) individually or in groups in order to bring about locally different pressure conditions in the area of the work surface of support (18). Such a local distribution can then also be changed once or several times during the manufacturing process. The suction openings (55) are actuated for this correspondingly individually or in groups.

Various modifications of the embodiments shown and described are possible. On the one hand, arching means (17) may have a different design and a different function. Arch (22) may also be produced in another manner than by mechanical bending, which depends, among other things, on the type and design of the arched layer (3, 4, 6). In particular, carrying plate (30) may have multiple members and be movable in itself and represent an arching means (17). Bending may take place here in the gap area and at the ribbons or other element connections (16).

The features of the present invention disclosed in the above description, the claims and the drawings may be significant for the implementation of the present invention in various embodiments thereof both individually and in any desired combination.

While specific embodiments of the invention have been shown and described in detail to illustrate the application of the principles of the invention, it will be understood that the invention may be embodied otherwise without departing from such principles.

The invention claimed is:

1. A manufacturing device for a multilayer module, a solar module, or a multilayer basic component of a module with a translucent plate-like layer and with an array of photoactive elements with interspaces between the photoactive elements, wherein the manufacturing device forms the layer structure, the manufacturing device comprising:
an applicator for a liquid or pasty bonding compound;
a controllable arching means for bending the plate-like layer, which is in the form of a glass plate, wherein the arching means comprises:
a substrate support for supporting the array of photoactive elements and for supporting the plate-like layer wherein the support has a controllable suction device with suction openings in a support area of the photoactive elements;
a holding-down device or a fixing device arranged at a support edge; and
a height-adjustable pressing element acting on the plate-like layer, wherein the photoactive elements can be embedded in the bonding compound in a bubble-free manner, such that at least a part of an outer surface of the photoactive element is covered by the bonding compound upon which an arch of the plate-like layer on the array of photoactive elements with the bonding compound applied thereto can be relaxed.

2. A manufacturing device in accordance with claim 1, wherein arching means produces a relaxable arch or curvature of the plate-like layer.

3. A manufacturing device in accordance with claim 1, wherein the pressing element is arranged at an edge area of the support and the holding-down device or the Fixing device is arranged at another edge area of the support.

4. A manufacturing device in accordance with claim 1, wherein the arching means further comprises an additional pressing element, the additional pressing element acting on the reverse side of a plate-like layer from the pressing element, wherein a feed of the additional pressing element along the plate-like layer and a retracting motion of the pressing element are coordinated with one another for a controlled relaxation of the arch of the layer.

5. A manufacturing device in accordance with claim 4, wherein the arching means further comprises a moving means for moving the additional pressing element along the plate-like layer and for pressing the additional pressing element against a back of the plate-like layer.

6. A manufacturing device in accordance with claim 1, wherein the applicator comprises a dispensing means for dispensing a paste-like or liquid bonding compound.

7. A manufacturing device in accordance with claim 1, further comprising a heating means for heating the layers of the module.

8. A manufacturing device in accordance with claim 1, further comprising an applicator for applying further layers on a side of a multilayer base component.

9. A process for manufacturing an array of layers with a plurality of photoactive elements for a multilayer module, the process comprising the steps of:
forming an array of photoactive elements on a support substrate, formed with suction openings, by depositing the photoactive elements on the substrate;
applying a liquid or paste-like bonding compound to the array of photoactive elements; and
forming an adhering system of layers with the array of photoactive elements and with a plate-like layer, the step of forming an adhering system of layers comprising the steps of:
placing the plate-like layer on the array of photoactive elements by means of an arching means providing an arch or curvature;
applying a suction acting, at least in interspaces between the photoactive elements deposited on the substrate, via the suction openings; and
embedding photoactive elements in the bonding compound in a bubble-free manner such that at least part of an outer surface of the photoactive elements is covered by the bonding compound by the arch of the plate-like layer on the array of photoactive elements with the bonding compound applied thereto being subsequently relaxed and the bonding compound being incorporated at least into the interspaces under the suction effect of the suction pressure.

10. A process in accordance with claim 9, wherein based on the suction pressure at least in peripheral edge areas of the photoactive elements, the bonding compound reaches an area in which the surface of the substrate and an associated surface of the photoactive elements are located opposite each other in a bubble-free manner.

11. A process in accordance with claim 9, wherein the depositing of the photoactive elements on the substrate comprises contacting the photoactive elements on a front side and/or on a rear side and depositing the photoactive elements on the substrate when the array of photoactive elements are formed, and forming contact lines arranged in surface depressions on substrate when depositing the photoactive elements when the photoactive elements are contacted on the front side.

12. A process in accordance with claim 9, wherein a standing wave of the bonding compound running over the array of photoactive elements is produced during the relaxation of the arch or curvature of the plate-like layer in a wedge between the array of photoactive elements on substrate and the surface of the plate-like layer facing the array of photoactive elements.

13. A process in accordance with claim 9, wherein a silicone or silicone-containing compounds is used as the liquid or paste-like bonding compound.

14. A process in accordance with claim 9, wherein the controlled relaxation of the arch or curvature includes feeding a pressing element along the plate-like layer and providing an arch entering motion of a pressing element in a mutually coordinated manner during the formation of the adhering system of layers.

15. A process in accordance with claim 9, further comprising the step of:
providing a manufacturing device comprising:
an applicator for applying the liquid or paste-like bonding compound to the array of photoactive elements;
the arching means as a controllable arching means for bending the plate-like layer, which is in the form of a glass plate, wherein the arching means comprises:
a substrate support for supporting the array of photoactive elements and for supporting the plate-like layer wherein the support has a controllable suction device with suction openings in a support area of the photoactive elements;
a holding-down device or a fixing device arranged at a support edge; and
a height-adjustable pressing element acting on the plate-like layer;
a suction forming device connected to the support substrate applying a suction acting, at least in interspaces between the photoactive elements deposited on the substrate, via the suction openings; and
a control for controlling the suction device and controlling the arching means, wherein the photoactive elements can be embedded in the bonding compound in a bubble-free manner, such that at least a part of an outer surface of the photoactive element is covered by the bonding compound upon which an arch of the plate-like layer on the array of photoactive elements with the bonding compound applied thereto can be relaxed, wherein the manufacture of a multilayer module with a plurality of photoactive elements provides a solar module with solar cells.

16. A manufacturing device for manufacturing an array of layers with a plurality of photoactive elements forming a multilayer module, the manufacturing device comprising:
a support substrate formed with suction openings, the support substrate receiving an array of photoactive elements that are deposited on the substrate;
an applicator applying a liquid or paste-like bonding compound to the array of photoactive elements; and
an arching means providing an arch or curvature for placing the plate-like layer on the array of photoactive elements and forming an adhering system of layers with the array of photoactive elements and with the plate-like layer;
a suction forming device connected to the support substrate applying a suction acting, at least in interspaces between the photoactive elements deposited on the substrate, via the suction openings; and
a control for controlling the suction device and controlling the arching means for embedding the photoactive elements in the bonding compound in a bubble-free manner such that at least part of an outer surface of the photoactive elements is covered by the bonding compound by the arch of the plate-like layer on the array of photoactive elements with the bonding compound applied thereto and the arch being subsequently relaxed and the bonding compound being incorporated at least into the interspaces under the suction effect of the suction pressure.

17. A manufacturing device in accordance with claim 16, wherein:
the arching means comprises a height-adjustable pressing element acting on the plate-like layer and an additional pressing element acting along a reverse side of a plate-like layer; and
the controlled relaxation of the arch or curvature includes feeding the additional pressing element of the arching means along the plate-like layer and providing an arch entering motion of the height-adjustable pressing element of the arching means in a mutually coordinated manner during the formation of the adhering system of layers.

18. A manufacturing device in accordance with claim 17, wherein: the arching means further comprises a moving means for moving the additional pressing element along the plate-like layer and for pressing the additional pressing element against a back of the plate-like layer.

19. A manufacturing device in accordance with claim 16, further comprising a heating means for heating the layers of the module.

20. A manufacturing device in accordance with claim 16, wherein a standing wave of the bonding compound running over the array of photoactive elements is produced during the relaxation of the arch or curvature of the plate-like layer in a wedge between the array of photoactive elements on substrate and the surface of the plate-like layer facing the array of photoactive elements.

* * * * *